US010358580B2

(12) United States Patent
Ikeda et al.

(10) Patent No.: US 10,358,580 B2
(45) Date of Patent: Jul. 23, 2019

(54) ADHESIVE COMPOSITION, RESIN CURED PRODUCT OBTAINED FROM ADHESIVE COMPOSITION, METHOD FOR MANUFACTURING SEMICONDUCTOR DEVICE USING ADHESIVE COMPOSITION, AND SOLID-STATE IMAGING ELEMENT

(71) Applicant: HITACHI CHEMICAL COMPANY, LTD., Tokyo (JP)

(72) Inventors: Aya Ikeda, Tokyo (JP); Shinjiro Fujii, Tokyo (JP); Sadaaki Katou, Tokyo (JP); Syougo Kikuchi, Tokyo (JP); Shu Hashimoto, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/115,010

(22) PCT Filed: Jan. 29, 2015

(86) PCT No.: PCT/JP2015/052542
§ 371 (c)(1),
(2) Date: Jul. 28, 2016

(87) PCT Pub. No.: WO2015/115552
PCT Pub. Date: Aug. 6, 2015

(65) Prior Publication Data
US 2016/0340554 A1 Nov. 24, 2016

(30) Foreign Application Priority Data

Jan. 29, 2014 (JP) .................................. 2014-014863

(51) Int. Cl.
*C09J 4/06* (2006.01)
*H01L 23/00* (2006.01)
(Continued)

(52) U.S. Cl.
CPC ............... *C09J 4/06* (2013.01); *C08F 220/18* (2013.01); *C08F 265/06* (2013.01);
(Continued)

(58) Field of Classification Search
CPC .......... C09J 4/06; C09J 133/08; C08F 220/18; C08F 265/06
See application file for complete search history.

(56) References Cited

U.S. PATENT DOCUMENTS

2001/0044075 A1  11/2001  Nishimura
2007/0117349 A1   5/2007  Komatsu et al.
(Continued)

FOREIGN PATENT DOCUMENTS

CN    1930263      3/2007
CN    1954411 A    4/2007
(Continued)

OTHER PUBLICATIONS

Office Action of U.S. Appl. No. 15/114,983 dated Jun. 8, 2017.
(Continued)

*Primary Examiner* — Anthony Ho
(74) *Attorney, Agent, or Firm* — Fitch, Even, Tabin & Flannery, L.L.P.

(57) ABSTRACT

An adhesive composition comprising (a) a compound having at least two ethylenically unsaturated groups, (b) a thermal polymerization initiator, (c) a hindered phenolic compound, (d) a thioether compound and (e) a compound having a thiol group.

13 Claims, 17 Drawing Sheets

(51) Int. Cl.
  *H01L 27/146* (2006.01)
  *H01L 23/29* (2006.01)
  *C08F 220/18* (2006.01)
  *C08F 265/06* (2006.01)
  *C09J 9/00* (2006.01)
  *C09J 11/06* (2006.01)
  *C09J 133/08* (2006.01)
  *C08F 290/06* (2006.01)
  *C08K 5/134* (2006.01)
  *C08K 5/1575* (2006.01)
  *C08K 5/3492* (2006.01)
  *C08K 5/372* (2006.01)

(52) U.S. Cl.
  CPC ............ *C08F 290/067* (2013.01); *C09J 9/00* (2013.01); *C09J 11/06* (2013.01); *C09J 133/08* (2013.01); *H01L 23/293* (2013.01); *H01L 24/97* (2013.01); *H01L 27/14618* (2013.01); *H01L 27/14627* (2013.01); *H01L 27/14632* (2013.01); *H01L 27/14683* (2013.01); *H01L 27/14687* (2013.01); *C08F 2220/1825* (2013.01); *C08K 5/1345* (2013.01); *C08K 5/1575* (2013.01); *C08K 5/34924* (2013.01); *C08K 5/372* (2013.01); *H01L 2224/48091* (2013.01); *H01L 2224/48227* (2013.01); *H01L 2224/73265* (2013.01)

(56) References Cited

U.S. PATENT DOCUMENTS

| | | |
|---|---|---|
| 2007/0257285 A1 | 11/2007 | Yang |
| 2009/0026383 A1 | 1/2009 | Kim |
| 2010/0165267 A1 | 7/2010 | Yoshida |
| 2011/0140282 A1 | 6/2011 | Nakano |
| 2013/0168761 A1 | 7/2013 | Hsieh |

FOREIGN PATENT DOCUMENTS

| | | |
|---|---|---|
| CN | 101490759 A | 7/2009 |
| CN | 101910344 A | 12/2010 |
| CN | 102375340 | 3/2012 |
| CN | 103249791 A | 8/2013 |
| CN | 103257527 | 8/2013 |
| CN | 103992751 A | 8/2014 |
| CN | 105378899 A | 3/2016 |
| JP | H04-202335 A | 7/1992 |
| JP | 2001-302870 A | 10/2001 |
| JP | 2005-142221 A | 6/2005 |
| JP | 2006-137855 A | 6/2006 |
| JP | 2006-193660 A | 7/2006 |
| JP | 2006-213848 A | 8/2006 |
| JP | 2006-233074 A | 9/2006 |
| JP | 2007-281375 A | 10/2007 |
| JP | 2010-001449 A | 1/2010 |
| JP | 2010-040621 A | 2/2010 |
| JP | 2010-106095 A | 5/2010 |
| JP | 2010-132801 A | 6/2010 |
| JP | 2010-177613 A | 8/2010 |
| JP | 2011-509332 A | 3/2011 |
| JP | 2011-140626 A | 7/2011 |
| JP | 2011-169828 A | 9/2011 |
| JP | 2011-213953 A | 10/2011 |
| JP | 2012-053229 A | 3/2012 |
| JP | 2012-058725 A | 3/2012 |
| JP | 2012-107191 A | 6/2012 |
| JP | 2012-167174 A | 9/2012 |
| JP | 2013-054168 A | 3/2013 |
| JP | 2013-118230 A | 6/2013 |
| JP | 2013-122577 A | 6/2013 |
| JP | 2013-184966 A | 9/2013 |
| JP | 2013-184996 A | 9/2013 |
| JP | 2014-005320 A | 1/2014 |
| TW | 200825108 A | 6/2008 |
| TW | 201231585 A1 | 8/2012 |
| WO | 2008/020570 A1 | 2/2008 |
| WO | 2009/088191 A2 | 7/2009 |
| WO | 2012/077806 A1 | 6/2012 |
| WO | 2013/066597 A1 | 5/2013 |

OTHER PUBLICATIONS

Office Action of counterpart CN Patent Application No. 201580005756.8 dated Apr. 28, 2017.
International Preliminary Report on Patentability of WO Patent Application No. PCT/JP2015/052544 dated Aug. 11, 2016 in English.
International Preliminary Report on Patentability of WO Patent Application No. PCT/JP2015/052542 dated Aug. 11, 2016 in English.
International Preliminary Report on Patentability of WO Patent Application No. PCT/JP2015/052505 dated Aug. 11, 2016 in English.
International Search Report of WO Patent Application No. PCT/JP2015/052544 dated Apr. 28, 2015 in English.
International Search Report of WO Patent Application No. PCT/JP2015/052542 dated Apr. 28, 2015 in English.
International Search Report of WO Patent Application No. PCT/JP2015/052505 dated Apr. 28, 2015 in English.
Office Action of CN Patent Application No. 201580005738.X dated Mar. 30, 2017.
Notice of Allowance of U.S. Appl. No. 15/115,057 dated Sep. 8, 2017.
Office Action of U.S. Appl. No. 15/115,057 dated Feb. 15, 2017.
English language machine translation of JP 2013-184996 to Kamiya et al.

US 10,358,580 B2

ADHESIVE COMPOSITION, RESIN CURED PRODUCT OBTAINED FROM ADHESIVE COMPOSITION, METHOD FOR MANUFACTURING SEMICONDUCTOR DEVICE USING ADHESIVE COMPOSITION, AND SOLID-STATE IMAGING ELEMENT

TECHNICAL FIELD

The present invention relates to an adhesive composition, a cured-resin product obtained from adhesive composition, a method for manufacturing a semiconductor device using the adhesive composition and a solid-state imaging element.

BACKGROUND ART

Recently, along with the popularization of digital still cameras and camera-equipped cellular phones, low power consumption and miniaturization of solid-state imaging elements have proceeded and CMOS (Complementary Metal Oxide Semiconductor) image sensors have been more and more used other than conventional CCD (Charge Coupled Device) image sensors. These image sensors are each formed of a sensor section (imaging pixel section), in which a plurality of pixels are two-dimensionally arranged in a single semiconductor chip, and a peripheral circuit section arranged outside the sensor section.

As the structure to a CMOS image sensor, a "frontside-illuminated" structure and a "backside-illuminated" structure are known (see, for example, Patent Literatures 1 and 2). In the frontside-illuminated CMOS image sensor of Patent Literature 1, incident light from outside passes through a glass substrate and a cavity and enters each of microlenses. The light beams are converged by the microlenses, pass through a color filter layer and a wiring layer and enter photodiodes. The light incident on the photodiodes is photo-electrically converted to generate signal charges and then electrical signals are produced from signal charges to obtain image data.

In contrast, in the backside-illuminated CMOS image sensor of Patent Literature 2, photodiodes are formed on one of the surface of a semiconductor substrate. On the same surface, a color filter layer and microlenses are arranged. Above the microlenses, a glass substrate is arranged via an adhesive layer and a cavity. On the other surface of the semiconductor substrate, a wiring layer is provided. According to the backside-illuminated structure, since light incident on the microlenses is received by a light receiving section without passing through the wiring layer, attenuation of light by the wiring layer is avoided and the light-receiving sensitivity is enhanced.

As the backside-illuminated CMOS image sensor, a structure, which comprises an adhesive layer formed on a silicon substrate having microlenses and in the outer periphery of the microlenses so as not to cover the microlenses, a low refractive index layer formed in the cavity surrounded by the adhesive layer, and a glass substrate formed via the adhesive layer and the low refractive index layer, is disclosed (see Patent Literature 3).

CITATION LIST

Patent Literature

Patent Literature 1: JP 2007-281375 A
Patent Literature 2: JP 2005-142221 A
Patent Literature 3: JP 2010-40621 A

SUMMARY OF INVENTION

Technical Problem

In the backside-illuminated CMOS image sensor having a cavity as described in, for example, Patent Literature 2, the difference in refractive index between layers is large because a glass substrate usually has a refractive index: nD=about 1.47; air in the cavity portion has a refractive index: nD=about 1.00; and the microlens has a refractive index: nD=about 1.60. Because of this, a problem that incident light is reflected at the interface and a light loss is produced occurs.

Patent Literature 3 discloses a backside-illuminated CMOS image sensor having a structure (non-cavity structure) formed by filling a cavity portion with a low refractive index layer. The low refractive index layer is formed of a low refractive index material having a refractive index of 1.4 or less and can have a large relative refractive index to microlenses. For the reason, this structure is more effective.

However, Patent Literature 3 does not describe occurrence of light loss produced by difference in refractive index of the aforementioned layers. Patent Literature 3 suggests that formation of a cavity may be avoided by forming an adhesive layer consisting of an adhesive having a low-refractive index over the whole surface of a silicon substrate in place of providing the low refractive index layer; however, a material suitable for practical use and having a sufficiently low refractive index and a sufficiently high optical transparency and adhesiveness is not actually found and thus this method is not realistic.

The present invention was made in consideration of such a circumstance and is directed to provide an adhesive composition, enabling to constitute an adhesive layer over the whole surface of a semiconductor substrate such as a silicon substrate, by imparting adhesiveness to a transparent resin to be supplied to the cavity portion; and having a satisfactory property as a transparent adhesive, i.e., a high transparency after curing, and low in coloring and peel-off by heating at 260° C.

Solution to Problem

As a result of intensive studies, the present inventors have found that the aforementioned problems can be overcome by an adhesive composition comprising predetermined components, and accomplished the present invention.

More specifically, the present invention provides an adhesive composition, comprising (a) a compound having at least two ethylenically unsaturated groups, (b) a thermal polymerization initiator, (c) a hindered phenolic compound, (d) a thioether compound and (e) a compound having a thiol group. Such an adhesive composition has high transparency after curing, high transparency after a reflow process at 260° C. and excellent adhesiveness at 260° C. In particular, since a three dimensional crosslinking proceeds by adding (b) a thermal polymerization initiator, sufficient adhesiveness can be maintained even after a reflow process is performed at 260° C. In addition, since (c) a hindered phenolic compound, (d) a thioether compound and (e) a compound having a thiol group are blended, coloring with heat is suppressed, with the result that high transparency can be ensured. Further, since a transparent resin having a larger refractive index than air (for example, nD=about 1.50) is supplied to the aforementioned cavity portion, a problem of light loss as mentioned above can be also overcome.

It is preferable that the adhesive composition further comprises (f) an acrylic polymer having a weight-average molecular weight of 100000 or more. Owing to the content of such an acrylic polymer, the effects of the present invention can be more remarkably produced. In particular, it is more preferable that the acrylic polymer contains a structural unit having an epoxy group. Owing to this, it is possible to more effectively exhibit excellent crack resistance, adhesiveness and heat-resistance, and ensure storage stability.

It is preferable that the (a) compound having at least two ethylenically unsaturated groups includes a urethane compound having (meth)acryloyl groups. Owing to this, a reactivity of a curing reaction increases, with the result that a balance between high-heat resistance and high-adhesiveness of a cured product of the adhesive composition can be more highly achieved.

The present invention provides an adhesive composition as mentioned above for use in optical parts. Since the aforementioned adhesive composition has a larger refractive index than air, high transparency after curing, high transparency after a reflow process is performed at 260° C. and excellent adhesiveness at 260° C., the adhesive composition can be used for optical parts and exerts an excellent effect at the time.

The present invention provides a cured-resin product obtained from the aforementioned adhesive composition. Such a cured-resin product has high transparency, and low in coloring and peel-off even after a reflow process is performed at 260° C.

The present invention further provides a method for manufacturing a semiconductor device, comprising a step of forming an adhesive layer of the aforementioned adhesive composition on a semiconductor substrate; a step of sandwiching the adhesive layer between the semiconductor substrate and a transparent substrate and applying pressure onto the semiconductor substrate and the transparent substrate for bonding; and a step of curing the adhesive layer. The aforementioned adhesive composition has an excellent function as an adhesive and provides highly transparent cured product. Because of this, an excellent effect can be exerted if the adhesive composition is used in the steps of manufacturing a semiconductor device and the properties of the resultant semiconductor device become satisfactory.

The present invention further provides a solid-state imaging element having a semiconductor substrate having a light receiving section provided on the upper surface, an adhesive layer provided on the semiconductor substrate so as to cover the light receiving section, and a transparent substrate bonded to the semiconductor substrate via the adhesive layer, in which the adhesive layer is formed of the aforementioned cured-resin product. Since the solid-state imaging element having such a structure employs a cured-resin product obtained from the aforementioned adhesive composition, not only a construct having an adhesive layer provided in the periphery so as not to cover microlenses and a cavity surrounded by the adhesive layer filled with the cured-resin product, but also a construct having the cured-resin product formed over the whole surface of a substrate, can be employed.

Advantageous Effects of Invention

According to the present invention, by imparting adhesiveness to a transparent resin to be supplied to a cavity portion, an adhesive layer can be formed over the whole surface of a semiconductor substrate such as a silicon substrate; at the same time, it is possible to provide an adhesive composition having a satisfactory property as a transparent adhesive, i.e., high transparency after curing, and low in coloring and peel-off due to heating at 260° C.

According to the present invention, it is also possible to provide a cured-resin product obtained from the aforementioned adhesive composition, a method for manufacturing a semiconductor device using the adhesive composition, and a solid-state imaging element having a cured-resin product obtained from the adhesive composition.

DESCRIPTION OF EMBODIMENTS

Figure 1:
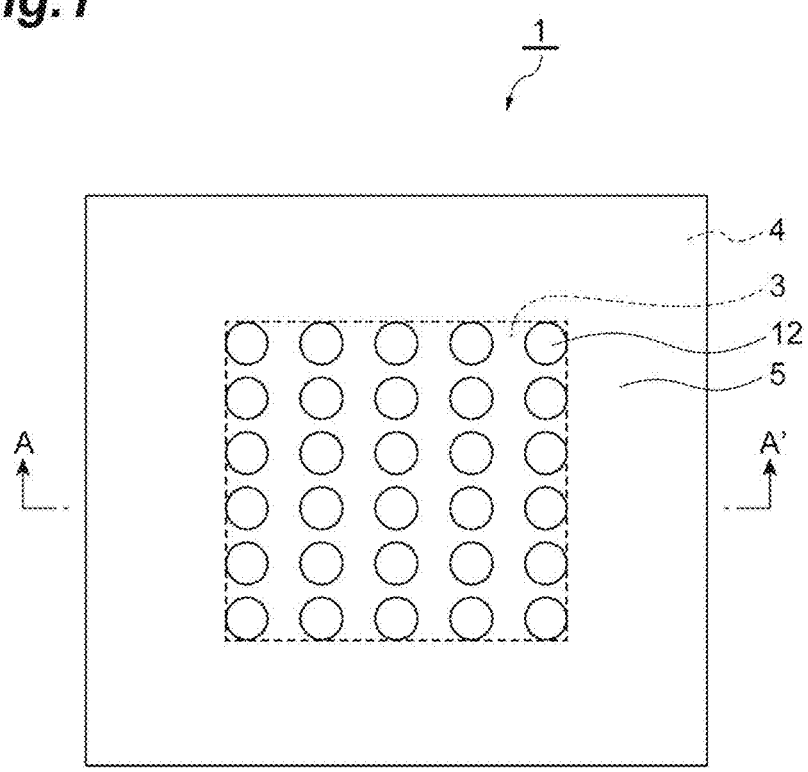
FIG. 1 is a plan view showing a solid-state imaging element according to the embodiment.

Now, preferred embodiments of the present invention will be described below; however, the present invention is not limited to these embodiments. Note that, in the specification, the "(meth)acryloyl group" refers to an "acryloyl group" or a "methacryloyl group" corresponding thereto. The same applies to other analogous expressions such as (meth)acrylate.

In the specification, the "transparency" means that interaction between an adhesive composition and visible light rarely occurs and absorption and scattering of electromagnetic waves rarely occur. As the index of "transparency", transmittance is used, which is the intensity ratio of incident light and transmitted light expressed on percentage. The transmittance varies depending upon the wavelength of target light. In the specification, visible light is targeted. The electromagnetic wave corresponding to the visible light has a lower limit wavelength of about 400 nm and an upper limit wavelength of about 760 nm, according to the definition of JIS Z8120.

In the specification, the term "layer" refers to a layer having a structure formed over a whole surface at planer view; however, a layer structure formed on a part of a surface is also included.

In the specification, the term "step" refers not only to an independent step but also a step which cannot be clearly distinguished from another step but can attain a predetermined purpose of the step is included in the term.

In the specification, the numerical range expressed by using "to" refers to the range including the numeric values before and after "to" as the minimum value and the maximum value, respectively. In the specification, in the numerical ranges described stepwise, the upper or lower limit of the numerical range of a certain step may be replaced with the upper or lower limit of the numerical range of another stage. In the numerical range described in the specification, the upper or lower limit of the numerical range thereof can be replaced with values described in Examples.

<Adhesive Composition>

The adhesive composition according to the embodiment comprises (a) a compound having at least two ethylenically unsaturated groups, (b) a thermal polymerization initiator, (c) a hindered phenolic compound, (d) a thioether compound and (e) a compound having a thiol group. Note that, in the specification, these components will be sometimes referred to as a component (a), a component (b), a component (c), a component (d), a component (e), etc.

<(a) Compound Having at Least Two Ethylenically Unsaturated Groups>

The compound having at least two ethylenically unsaturated groups to be used in the embodiment is preferably a compound having at least two (meth)acryloyl groups. Examples of the compound having at least two ethylenically unsaturated groups include polyfunctional (meth)acrylic monomers having an alicyclic skeleton, polyfunctional (meth)acrylic monomers having an aliphatic skeleton, polyfunctional (meth)acrylic monomers having a dioxane glycol skeleton and polyfunctional (meth)acrylic monomers having a functional group. Note that, the term "polyfunctional" herein is used with respect to an ethylenically unsaturated group, and means that at least two or more ethylenically unsaturated groups are present in a compound.

In order to improve the transparency of a cured product, a polyfunctional (meth)acrylic monomer having an alicyclic skeleton and a polyfunctional (meth)acrylic monomer having a dioxane glycol skeleton are preferable. In contrast, in order to more effectively suppress a crack of a cured product and peeling thereof from a base material, it is preferable to use a polyfunctional (meth)acrylic monomer having an aliphatic skeleton.

Examples of the polyfunctional (meth)acrylic monomer include the following (meth)acrylic monomers having two (meth)acryloyl groups.

Examples of the (meth)acrylic monomer having two (meth)acryloyl groups include cyclohexane-1,4-dimethanol di(meth)acrylate, cyclohexane-1,3-dimethanol di(meth)acrylate, tricyclodecanedimethylol di(meth)acrylate (for example, KAYARAD R-684: tricyclodecanedimethylol diacrylate, Nippon Kayaku Co., Ltd.), tricyclodecanedimethanol di(meth)acrylate (for example, A-DCP: tricyclodecanedimethanol diacrylate, SHIN-NAKAMURA CHEMICAL CO., LTD.), dioxane glycol di(meth)acrylate (for example, KAYARAD R-604: dioxane glycol diacrylate, Nippon Kayaku Co., Ltd.; and A-DOG: dioxane glycol diacrylate, Shin-Nakamura Chemical Co., Ltd.), neopentyl glycol di(meth)acrylate, dicyclopentanyl di(meth)acrylate, 1,6-hexanediol di(meth)acrylate, ethylene oxide-modified 1,6-hexanediol di(meth)acrylate, neopentyl glycol di(meth)acrylate, (poly)ethylene oxide-modified neopentyl glycol di(meth)acrylate, hydroxypivalic acid neopentyl glycol di(meth)acrylate, polyethylene glycol di(meth)acrylate, polypropylene glycol di(meth)acrylate, ethylene oxide-modified bisphenol A di(meth)acrylate (preferably polyethylene oxide-modified bisphenol A di(meth)acrylate, more preferably ethylene oxide (5 to 15 mol)-modified bisphenol A di(meth)acrylate), and (poly)ethylene oxide-modified phosphoric acid di(meth)acrylate.

Of them, in order to improve the transparency of a cured product, dioxane glycol diacrylate or tricyclodecanedimethanol diacrylate is more preferable.

Examples of the polyfunctional (meth)acrylic monomer may include (meth)acrylic monomers having three (meth)acryloyl groups, such as pentaerythritol tri(meth)acrylate, ethylene oxide-modified isocyanuric acid tri(meth)acrylate.

Examples of the polyfunctional (meth)acrylic monomer include a (meth)acrylate compound having an amide bond; a compound obtained by reacting an α,β-unsaturated carboxylic acid with a polyhydric alcohol; a bisphenol A based (meth)acrylate compound; a compound obtained by reacting an α,β-unsaturated carboxylic acid with a glycidyl group-containing compound; and an alkyl (meth)acrylate ester copolymer having ethylenically unsaturated groups. These can be used alone or in combination of two or more.

The compound having at least two ethylenically unsaturated groups is preferably a urethane-based compound having (meth)acryloyl groups, because the reactivity is high and a balance between high-heat resistance and high-adhesiveness of a cured product of the adhesive composition can be more highly achieved.

As the urethane-based compound having (meth)acryloyl groups, for example, at least one selected from the group consisting of a urethane (meth)acrylate, which is a reaction product of the addition reaction between a (meth)acrylic monomer having a hydroxyl group at the β position, etc.; a diisocyanate compound; an ethylene oxide (EO)-modified urethane di(meth)acrylate; a propylene oxide (PO)-modified urethane di(meth)acrylate; EO/PO-modified urethane di(meth)acrylate; a urethane (meth)acrylate having a carboxyl group; and a reaction product of the reaction between a diol compound, a bifunctional epoxy(meth)acrylate having two hydroxyl groups and two ethylenically unsaturated groups and a polyisocyanate, is mentioned. Note that, "EO/PO-modified" means that both (poly)ethylene oxide and (poly)propylene oxide are present.

The (meth)acrylic monomer having a hydroxyl group at the aforementioned β position, etc. is, for example, at least one selected from the group consisting of 2-hydroxyethyl (meth)acrylate, dipentaerythritol penta(meth)acrylate and pentaerythritol tri(meth)acrylate. As the above diisocyanate compound is, for example, at least one selected from the group consisting of isophorone diisocyanate, 2,6-toluene diisocyanate, 2,4-toluene diisocyanate and 1,6-hexamethylene diisocyanate.

To satisfy high-level heat-resistance, rigidity and high adhesion, it is preferable that the number of functional groups (the number of (meth)acryloyloxy groups) and the weight-average molecular weight of a urethane-based compound having (meth)acryloyl groups are optimized. Owing to this, an excessive increase in viscosity is avoided and the range of materials to be selected is widened, with the result that the viscosity of the adhesive composition can be easily controlled. The viscosity of the adhesive composition can be reduced also by using a solvent; however, the amount of the solvent can be reduced by using a urethane-based compound having (meth)acryloyl groups optimized in number of functional groups and weight-average molecular weight. If the amount of solvent is reduced, satisfactory properties and reliability of the resin layer after curing are easily maintained.

The number of functional groups of a urethane-based compound having (meth)acryloyl groups is preferably 2 to 15 in order to improve heat-resistance, a property of adhesion and coating properties and further to improve pattern formability in the case where a photopolymerization initiator (described later) is contained. The number of functional groups is more preferably 2 to 12 and further preferably 2 to 10 in order to improve physical properties of a cured-resin layer and stability of the properties.

weight is more preferably 950 to 15000 in view of improvement of coating properties, and further preferably 950 to 11000 in view of compatibility. In the specification, a weight-average molecular weight (Mw) value refers to a standard polystyrene equivalent value obtained by measurement of gel permeation chromatography (GPC) using a developing solution such as tetrahydrofuran or toluene, and more specifically, is obtained by the same method as shown in the measuring the weight-average molecular weight of the component (f) shown in following Examples.

If the weight-average molecular weight is 950 or more, an extreme reduction in the viscosity of the adhesive composition is avoided and the adhesive composition applied on a substrate is suppressed from loosening. Also for the reason that a thick film can be easily formed and that reliability rarely decreases by cure shrinkage, it is preferable that the weight-average molecular weight is 950 or more. If the weight-average molecular weight is 25000 or less, an excessive increase in the viscosity of the resin composition is avoided, particularly satisfactory coating properties can be obtained and a thick film can be easily formed.

As a urethane-based compound having (meth)acryloyl groups, a compound represented by the following formula (11) is preferable in view of improvement of heat-resistance and a property of adhesion after curing and in view of improvement of strength of the resin layer having a pattern in the case a photopolymerization initiator (described later) is contained.

[Chemical Formula 1]

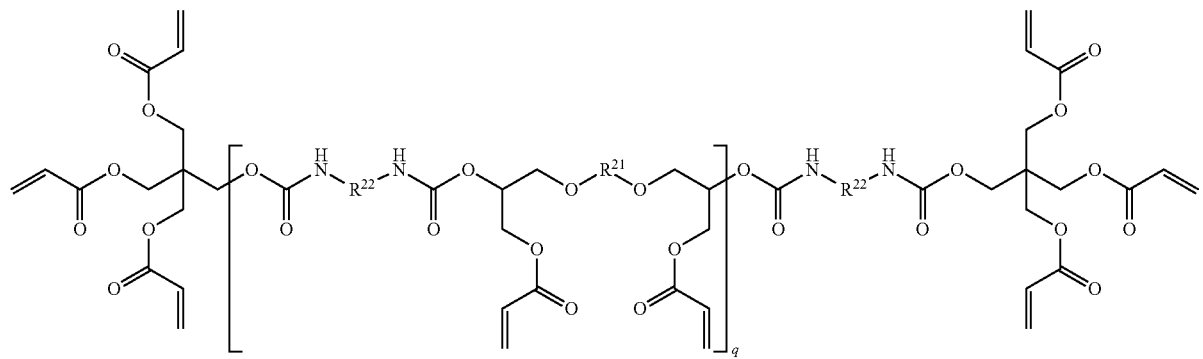

(11)

If the number of functional groups is 2 or more, the heat-resistance of the cured-resin layer and the rigidity of the resin layer at high temperatures can be further enhanced. If the number of functional groups is 15 or less, it is possible to suppress the cured-resin layer from being fragile and obtain more preferable a property of adhesion; and an excessive increase in the weight-average molecular weight of a (meth)acrylate compound is avoided, with the result that the viscosity of the adhesive composition is easily controlled to fall within an appropriate range and good coating properties are likely to obtain. In addition, retention of a large number of unreacted (meth)acryloyloxy groups after curing becomes less frequent, with the result that variation in physical properties and properties of the resin layer can be more effectively avoided.

The weight-average molecular weight (Mw) of a urethane-based compound having (meth)acryloyl groups is preferably 950 to 25000. The weight-average molecular In formula (11), $R^{21}$ and $R^{22}$ each independently represent a bivalent organic group. Specific examples thereof include a linear or branched alkylene group having 1 to 15 carbon atoms and a group having 1 to 20 carbon atom including an alicyclic group optionally having a substituent. The alicyclic group herein refers to a group having a cyclic structure in which carbon atoms bind cyclically. In the formula, q represents an integer of 1 or more, for example, 1 to 5. Examples of the "substituent" include halogen atoms such as a fluorine atom and a chlorine atom, an alkyl group, an allyl group, an ether group, an ester group, a carboxyl group and a cyano group. In particular, in view of improvement of heat-resistance after curing and in view of improvement of strength of the resin layer having a pattern in the case where a photopolymerization initiator (described later) is contained, it is preferable that $R^{22}$ is a bivalent group represented by the following structure.

[Chemical Formula 2]
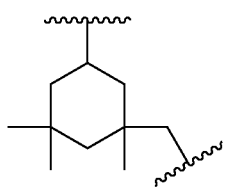
(5)
Other examples of the typical urethane-based compounds having (meth)acryloyl groups include, but are not limited to, compounds represented by the following formulas (12), (13), (14), (15) and (16).
[Chemical Formula 3]
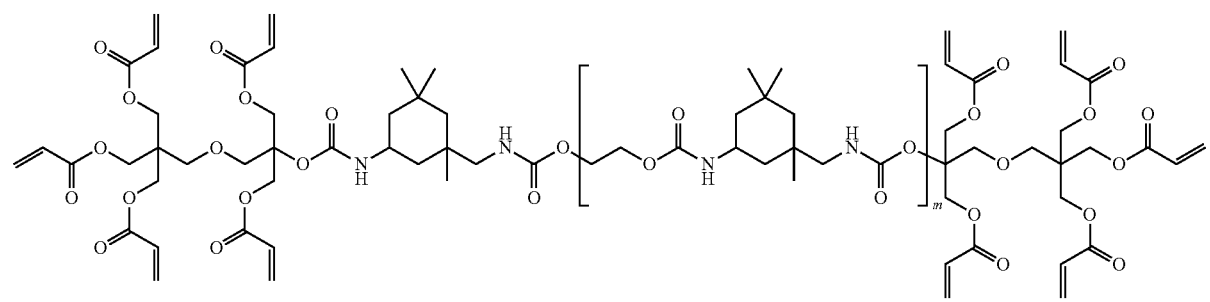
(12)
(In the formula (12), m represents an integer of 5 to 20.)
[Chemical Formula 4]
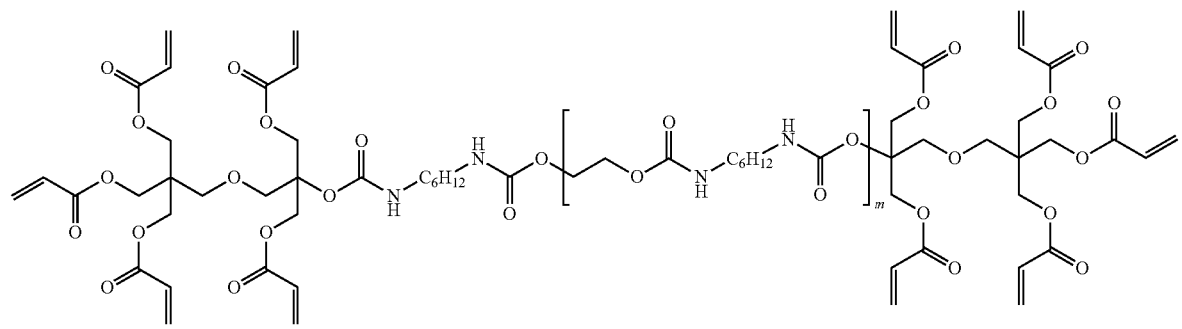
(13)
(In the formula (13), m represents an integer of 5 to 20.)
[Chemical Formula 5]
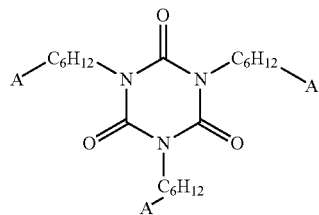
(14)

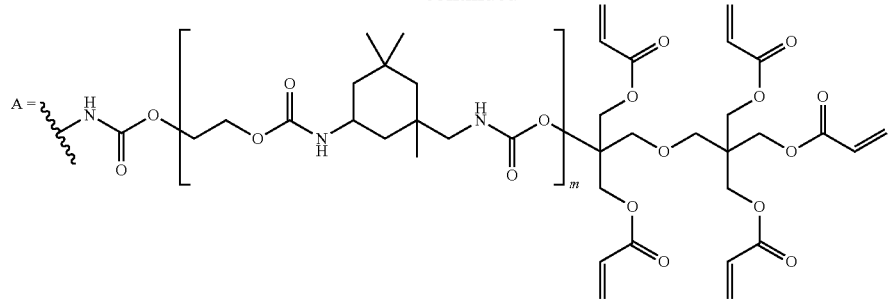

(In the formula (14), m represents an integer of 5 to 20.)

[Chemical Formula 6]

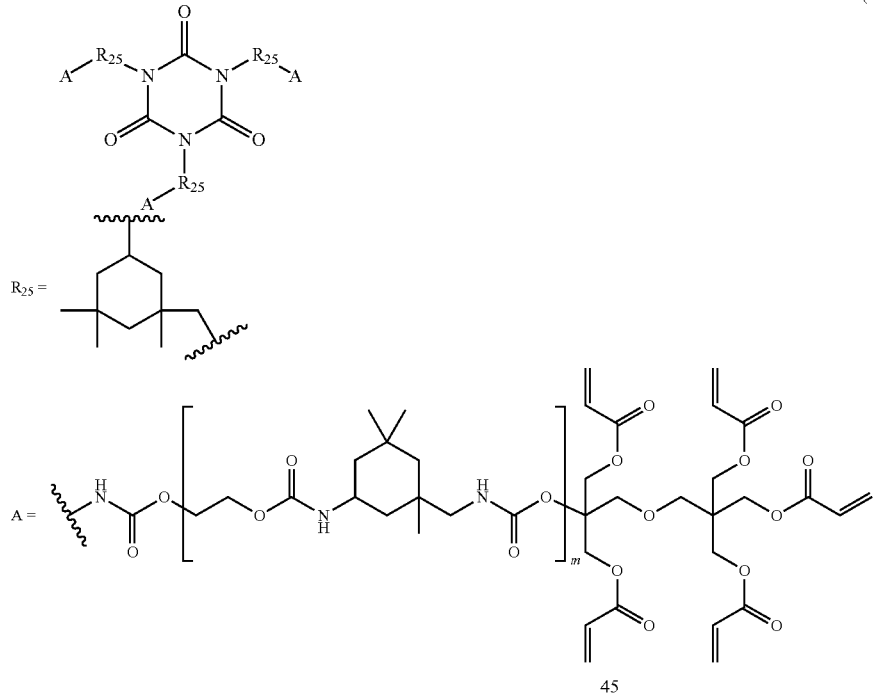

(In the formula (15), m represents an integer of 5 to 20.)

[Chemical Formula 7]

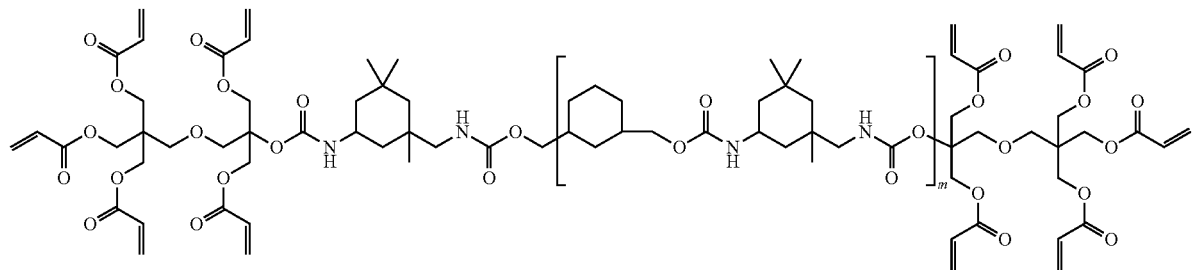

(In the formula (16), m represents an integer of 5 to 20.)

Examples of the commercially available compounds represented by the aforementioned formulas include UN-952 (the number of functional groups: 10, Mw: 6500 to 11000), which is a compound represented by the above formula (12).

Other examples of the commercially available urethane-based compounds having acryloyl groups (compound having acryloyloxy groups) include UN-904 (the number of functional groups: 10, Mw: 4900), UN-333 (the number of functional groups: 2, Mw: 5000), UN-1255 (the number of functional groups: 2, Mw: 8000), UN-2600 (the number of functional groups: 2, Mw: 2500), UN-6200 (the number of functional groups: 2, Mw: 6500), UN-3320HA (the number of functional groups: 6, Mw: 1500), UN-3320HC (the number of functional groups: 6, Mw: 1500), UN-9000PEP (the number of functional groups: 2, Mw: 5000), UN-9200A (the number of functional groups: 2, Mw: 15000), UN-3320HS (the number of functional groups: 15, Mw: 4900), UN-6301 (the number of functional groups: 2, Mw: 33000) (all of them are trade names of Negami Chemical Industrial Co., Ltd.); TMCH-5R (trade name, Hitachi Chemical Co., Ltd.; the number of functional groups: 2, Mw: 950); and KRM8452 (the number of functional groups=10, Mw=1200) and EBECRYL8405 (product obtained by addition reaction of urethane acrylate/1,6-hexane diol diacrylate=80/20, the number of functional groups: 4, Mw: 2700) (all of them are trade names of Daicel-Cytec Company Ltd.). Daicel-Cytec Company Ltd.)

Examples of the commercially available urethane-based compound having methacryloyloxy groups (compound having methacryloyloxy groups) include UN-6060PTM (trade name, Negami Chemical Industrial Co., Ltd.; the number of functional groups: 2, Mw: 6000), JTX-0309 (trade name, Hitachi Chemical Co., Ltd.) and UA-21 (trade name, SHIN-NAKAMURA. CHEMICAL CO., LTD.).

The content of a urethane-based compound having (meth) acryloyl groups, in order to improve heat-resistance, is preferably 10 mass % or more, more preferably 30 mass % or more and further preferably 50 mass % or more relative to the total amount of the component (a). If the content is 10 mass % or more, coating properties and various features required for cured product of the adhesive composition can be maintained at further higher levels. The content relative to the total amount of the component (a) is preferably 95 mass % or less, more preferably 85 mass % or less and further preferably 75 mass % or less.

The adhesive composition can employ, as the component (a), a urethane-based compound having (meth)acryloyl groups and a polyfunctional (meth)acrylic monomer except it in combination. Examples of the polyfunctional (meth) acrylic monomer include a (meth)acrylate compound having an amide bond, a compound obtained by reacting an α,β-unsaturated carboxylic acid with a polyhydric alcohol, a bisphenol A based (meth)acrylate compound, a compound obtained by reacting an α,β-unsaturated carboxylic acid with a glycidyl group-containing compound, and an alkyl (meth)acrylate ester copolymer having ethylenically unsaturated groups. These can be used alone or in combination of two or more. Note that, the adhesive composition according to the embodiment may comprise a monofunctional (meth) acrylic monomer other than the component (a). Examples of the monofunctional (meth)acrylic monomer include acrylic monomers represented by the following section of component (f).

<(b) Thermal Polymerization Initiator>

As the (b) thermal polymerization initiator according to the embodiment include organic peroxides such as t-hexyl peroxypivalate (PERHEXYL PV, trade name; one hour half-life temperature 71.3° C., 10 hours half-life temperature 53.2° C.), dilauroyl peroxide (PERHEXYL L, trade name; one hour half-life temperature 79.3° C., 10 hours half-life temperature 61.6° C.), di(3,5,5-trimethylhexanoyl)peroxide (PERLOYL 355, trade name; one hour half-life temperature 76.8° C., 10 hours half-life temperature 59.4° C.), 1,1,3,3-tetramethylbutylperoxy-2-ethyl hexanoate (PEROCTA O, trade name; one hour half-life temperature 84.4° C., 10 hours half-life temperature 65.3° C.), t-butylperoxy-2-ethyl hexanoate (PERBUTYL O, trade name; one hour half-life temperature 92.1° C., 10 hours half-life temperature 72.1° C.), benzoyl peroxide+water (NYPER BW, trade name; one hour half-life temperature 92.0° C., hours half-life temperature 73.6° C.), 1,1-di(t-hexylperoxy)-3,3,5-tri methylcyclohexane (PERHEXA TMH, trade name; one hour half-life temperature 106.4° C., 10 hours half-life temperature 86.7° C.), 1,1-di(t-hexylperoxy)cyclohexane (PERHEXA HC, trade name; one hour half-life temperature 107.3° C., 10 hours half-life temperature 87.1° C.), t-hexylperoxyisopropyl monocarbonate (PERHEXYL I, trade name; one hour half-life temperature 114.6° C., 10 hours half-life temperature 95.0° C.), t-butylperoxyisopropyl monocarbonate (PERBUTYL I, trade name; one hour half-life temperature 118.4° C., 10 hours half-life temperature 98.7° C.), dicumyl peroxide (PERCUMYL D, trade name; one hour half-life temperature 135.7° C., 10 hours half-life temperature 116.4° C.), and n-butyl 4,4-bis(t-butylperoxy) valerate (PERHEXA V trade name; one hour half-life temperature 126.5° C., 10 hours half-life temperature 104.5° C.); and azo compounds such as 2,2'-azobisisobutyronitrile, 1,1'-(cyclohexane-1,1-carbonitrile)-2,2'-azobis(2-cyclopropylpropionitrile) and 2,2'-azobis(2,4-dimethylvaleronitrile). These can be used alone or in combination of two or more.

Of these components (b), an organic peroxide is preferable since the effect of improving the physical properties of a cured product is large; and an organic peroxide having a 10 hours half-life temperature of 90 to 150° C. is more preferable since the balance between handling such as shelf life or pot life of the adhesive composition and curing is more satisfactorily maintained.

The blending amount of the component (b) relative to 100 parts by mass of the total amount of the component (a) is preferably 0.1 to 30 parts by mass, more preferably 0.2 to 20 parts by mass and further preferably 0.5 to 10 parts by mass.

Note that the half-life temperature of an organic peroxide is measured as follows.

An organic peroxide solution, which is prepared so as to have a concentration of 0.1 mol/L with benzene used as a solvent, is sealed in a glass tube purged with nitrogen. The glass tube is soaked in a thermostatic bath set at a predetermined temperature to carry out thermal decomposition. Generally, decomposition of an organic peroxide in a diluted solution can be approximately treated as a primary reaction. Thus, assuming that the amount of decomposed organic peroxide is represented by x (mol/L), the decomposition rate constant by k (1/h), time by t (h) and the initial organic peroxide concentration by a (mol/L), the following formula (1) and formula (2) are established.

$$dx/dt = k(a-x) \tag{1}$$

$$\ln\{a/(a-x)\} = kt \tag{2}$$

Since the half-life is a time period required until the initial concentration of organic peroxide to be decomposed is reduced by half, the half-life is represented by t1/2 and x of formula (2) is substituted by a/2, the following formula (3) is obtained.

$$kt1/2 = \ln 2 \tag{3}$$

Accordingly, if the thermal decomposition is carried out at a constant temperature; time (t) and value of $\ln\{a/(a-x)\}$ are plotted to obtain a linear line showing a relationship between them; and a value k is obtained from the inclination of the line, the half-life (t1/2) at the temperature can be obtained in accordance with formula (3).

On the other hand, as to the decomposition rate constant k, provided that the frequency factor is represented by A (1/h), the activation energy by E (J/mol), the gas constant by R (8.314 J/mol·K) and the absolute temperature by T (K), the following formula (4) is established.

$$\ln k = \ln A - \Delta E/RT \qquad (4)$$

From formula (3) and formula (4), k is deleted to obtain the following formula (5):

$$\ln(t1/2) = \Delta E/RT - \ln(A/2) \qquad (5)$$

Herein, t1/2 is obtained with respect to several temperature values. Values of ln(t1/2) and 1/T are plotted to obtain a linear line showing the relationship of them. From the linear line, temperature (one hour half-life temperature) at t1/2=1 h can be obtained. Similarly, 10 hours half-life temperature can be obtained assuming that t1/2=10 h.

Examples of a preferable organic peroxide of the thermal polymerization initiators mentioned above include dicumyl peroxide (PERCUMYL D) and n-butyl 4,4-bis(t-butylperoxy)valerate (Perhexa V).

Note that a thermal polymerization initiator, if it is used in combination with the component (a), exhibits excellent heat-resistance, peeling resistance and stress relaxation and improves the reliability of optical parts.

In the embodiment, (b) a thermal polymerization initiator may be blended and a photopolymerization initiator may be blended depending upon the situation.

Examples of the photopolymerization initiator include acylphosphine oxides, oxime esters, aromatic ketones, quinones, benzoin ether compounds, benzyl derivatives, 2,4,5-triarylimidazole dimers, acridine derivatives, coumarin compounds and N-phenylglycine derivatives. Note that, the photopolymerization initiator to be used in the embodiment may be synthesized by a conventional method or may be a commercially available compound.

Of these, in consideration of improvement photo-crosslinking, sensitivity and the transparency of the cured film, acylphosphine oxides or oxime esters are preferable.

Note that the photopolymerization initiators can be used alone or in combination of two or more.

Examples of the acylphosphine oxides include bis(2,4,6-trimethylbenzoyl)-phenylphosphine oxide (trade name: IRGACURE-819, BASF) and 2,4,6-trimethylbenzoyl-diphenylphosphine oxide (trade name: LUCIRIN TPO, BASF).

Examples of the oxime esters include 1,2-octanedione-1-[4-(phenylthio)phenyl-2-(O-benzoyloxime)] (trade name: IRGACURE-OXE01, BASF), 1-[9-ethyl-6-(2-methylbenzoyl)-9H-carbazol-3-yl]ethanone-1-(O-acetyl oxime) (trade name: IRGACURE-OXE02, BASF) and 1-phenyl-1,2-propanedione-2-[o-(ethoxycarbonyl)oxime] (trade name: Quantacure-PDO, Nippon Kayaku Co., Ltd.).

Examples of the aromatic ketones include, benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2,2-dimethoxy-1,2-diphenylethan-1-one (trade name: IRGACURE-651, BASF) 2-benzyl-2-dimethylamino-1-(4-morpholinophenyl)-butan-1-one (trade name: IRGACURE-369, BASF), 2-methyl-1-[4-(methylthio)phenyl]-2-morpholinopropan-1-one (trade name: IRGACURE-907, BASF), 2-hydroxy-1-{4-[4-(2-hydroxy-2-methyl-propionyl)-benzyl]phenyl}-2-methyl-propan-1-one (trade name: IRGACURE-127, BASF) and 1-hydroxycyclohexyl phenyl ketone (IRUGACURE-184, trade name, BASF).

Examples of the quinones include 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone.

Examples of the benzoin ether compounds include benzoin methyl ether, benzoin ethyl ether and benzoin phenyl ether.

Examples of the benzyl derivatives include benzoin compounds such as benzoin, methyl benzoin and ethyl benzoin; and benzyldimethylketal.

Examples of the 2,4,5-triarylimidazole dimers include 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer. Examples of the 2-(o-chlorophenyl)-4,5-diphenylimidazole dimer include 2-(2-chlorophenyl)-1-[2-(2-chlorophenyl)-4,5-diphenyl-1,3-diazol-2-yl]-4,5-diphenylimidazole.

Examples of the acridine derivatives include 9-phenyl acridine and 1,7-bis(9,9'-acridinyl)heptane.

Examples of the coumarin compounds include 7-amino-4-methylcoumarin, 7-dimethylamino-4-methylcoumarin, 7-diethylamino-4-methylcoumarin, 7-methylamino-4-methylcoumarin, 7-ethylamino-4-methylcoumarin, 7-dimethylamino cyclopenta[c]coumarin, 7-amino cyclopenta[c]coumarin, 7-diethylaminocyclopenta[c]coumarin, 4,6-dimethyl-7-ethylaminocoumarin, 4,6-diethyl-7-ethylaminocoumarin, 4,6-dimethyl-7-diethylaminocoumarin, 4,6-dimethyl-7-dimethylamino coumarin, 4,6-diethyl-7-ethylamino coumarin, 4,6-diethyl-7-dimethylaminocoumarin, 2,3,6,7,10,11-hexanehydro-1H,5H-cyclopenta[3,4][1]benzopyrano-[6,7,8-ij]quinolizine 12 (9H)-on, 7-diethylamino-5%7'-dimethoxy-3,3'-carbonyl biscoumarin, 3,3'-carbonylbis[7-(diethylamino)coumarin] and 7-diethylamino-3-thienoxylcoumarine.

Examples of N-phenylglycine derivatives include N-phenylglycine, N-phenylglycine butyl ester, N-p-methylphenylglycine, N-p-methylphenylglycine methyl ester, N-(2,4-dimethylphenyl)glycine and N-methoxyphenyl glycine.

The blending amount of the photopolymerization initiator relative to 100 parts by mass of the total amount of the component (a) is preferably 0.1 to 20 parts by mass, more preferably 0.5 to 10 parts by mass and further preferably 0.75 to 5 parts by mass. If the blending amount falls within the aforementioned range, foaming, turbidity, coloring and crack of the cured product can be more highly prevented.

<(c) Hindered Phenolic Compound>

The (c) hindered phenolic compound according to the embodiment is a compound having a phenolic hydroxyl group in a molecule and having an ability to trap a peroxide radical (ROO.) generated in a resin by heating. The hindered phenolic compound is not particularly limited as long as the aforementioned effect is produced. Examples thereof include 2,6-di-t-butyl-4-methylphenol, n-octadecyl-3-(3',5'-di-t-butyl-4'-hydroxyphenyl)propionate, tetrakis[methylene-3-(3,5-di-t-butyl-4-hydroxyphenyl)propionate]methane, 1,3,5-tris(3,5-di-t-butyl-4-hydroxybenzyl)-1,3,5-triazine-2,4,6(1H,3H,5H)-trione, 4,4',4"-(1-methylpropanyl-3-indene)tris(6-t-butyl-m-cresol), 3,9-bis{2-[3-(3-t-butyl-4-hydroxy-5-methylphenyl)propionyloxy]-1,1-dimethylethyl}-2,4,8,10-tetraoxaspiro[5.5]undecane and triethylene glycol-bis[3-(3-t-butyl-4- hydroxy-5-methylphenyl)propionate]. These can be used alone or in combination of two or more.

As the hindered phenolic compound, a commercially available compound generally on the market or a compound manufactured in accordance with a conventional method may be used.

Examples of the commercially available compound of the component (c) include Adekastab AO series (e.g., 30, 50, 60, 70, 80, 330) of ADEKA CORPORATION; and IRGANOX series (e.g., IRGANOX 1010, 1035, 1076, 1098, 1135, 1330, 1726, 1425, 1520, 245, 259, 3114) of Chiba Japan. Of these, AO-60 or AO-80 is preferable in order to further improve long-term stability against heat.

It is preferable that the content of the component (c) is 0.01 to 10 parts by mass relative to 100 parts by mass of the total amount of the component (a) in order to improve compatibility and coloration.

<(d) Thioether Compound>

The (d) thioether compound according to the embodiment is a compound having a thioether bond in a molecule, and preferably a compound represented by the following formula (17).

[Chemical Formula 8]

$$S(CH_2CH_2COOR^a)_2 \qquad (17)$$

(In the formula (17), a plurality of $R^a$ may be the same or different and each represent an alkyl group having 10 to 20 carbon atoms.)

As the thioether compound, a commercially available surfer-based antioxidant generally on the market or a compound manufactured in accordance with a conventional method may be used.

Examples of the thioether compound represented by the formula (17) include dilauryl thiodiisopropionate $(S(CH_2CH_2COOC_{12}H_{25})_2)$, ditridecyl thiodipropionate $(S(CH_2CH_2COOC_{13}H_{27})_2)$, dimyristyl thiodipropionate $(S(CH_2CH_2COOC_{14}H_{29})_2)$, lauryl stearyl thiodipropionate $((H_{25}C_{12}O(O)CCH_2CH_2)S(CH_2CH_2COOC_{18}H_{37}))$ and disteaeryl thiodipropionate $(S(CH_2CH_2COOC_{18}H_{37})_2)$.

It is preferable that the content of the thioether compound is 0.01 to 2 parts by mass relative to 100 parts by weight of the total amount of the component (a) in order to suppress oxidation deterioration of a cured product and improve compatibility and coloration of a cured product.

<(e) Compound Having a Thiol Group>

The (e) compound having a thiol group according to the embodiment is preferably a compound having a boiling point of 250° C. or more, more preferably a compound having a function of carrying out an addition reaction to a conjugate compound generated in a resin by heating and cutting a conjugate structure, particularly preferably a hydrogen donor exhibiting no basicity in which a quinone is decomposed, and further preferably a compound having 3 or more thiol groups.

As the compound having a thiol group in a molecule, a compound represented by the following formula (18) is preferable.

[Chemical Formula 9]

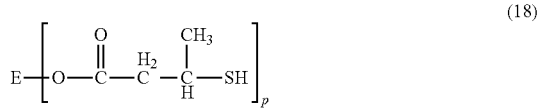

(18)

(In the formula (18), E represents a p-valent organic group and p represents an integer of 1 to 6.)

Examples of such a compound include 1,3,5-tris(3-mercaptobutyryloxyethyl)-1,3,5-triazine-2,4,6(1H,3H,5H)-trione and pentaerythritoltetrakis(3-mercaptobutyrate). These compounds can be obtained from SHOWA DENKO K.K. under the trade names of Karenz MT series (e.g., Karenz MT NR1, Karenz MT PE1). These compounds can be used alone or in combination of two or more.

It is preferable that the content of the compound having a thiol group in a molecule is 0.01 to 2 parts by mass relative to 100 parts by mass of the total amount of the component (a), in order to suppress oxidation deterioration of a cured product and improve compatibility and coloration of a cured product.

<Organic Solvent>

The adhesive composition according to the embodiment is prepared in a state like vanish by dissolving or dispersing other than components (a), (b), (c), (d) and (e), and, if necessary, an optional component(s) (described later) in an organic solvent. In this manner, the coating properties of the adhesive composition to a base material are improved, thereby improving workability.

The organic solvent to be used for obtaining a state like a varnish is not limited as long as the components of the adhesive composition are homogeneously stirred, mixed, melted, kneaded or dispersed, and solvents known in the art can be used. Examples of the organic solvent to be used, include, are not particularly limited to, alcohols, ethers, ketones, amides, aromatic hydrocarbons, esters and nitriles. More specifically, in consideration of volatility at low temperatures, low-boiling point solvents may be mentioned, which include diethyl ether, acetone, methanol, tetrahydrofuran, hexane, ethyl acetate, ethanol, methyl ethyl ketone and 2-propanol. In order to improve stability of a coating film, etc., high-boiling point solvents may be mentioned, which include toluene, methyl isobutyl ketone, 1-butanol, 2-methoxyethanol, 2-ethoxyethanol, xylene, N,N-dimethylacetamide, N,N-dimethylformamide, cyclohexanone, dimethyl acetamide, butyl cellosolve, dimethyl sulfoxide, propylene glycol monomethyl ether acetate, N-methyl-2-pyrrolidone and γ-butyrolactone. These organic solvents can be used alone or in combination of two or more.

Of these, methyl ethyl ketone, cyclohexanone, etc., are preferably used since they have an excellent solubility and a high drying rate.

The amount of organic solvent to be used in the adhesive composition according to the embodiment is determined by viscosity, etc., of a mixture like a vanish. The amount of organic solvent, which is not particularly limited, is preferably falls within the range of about 5 to 95 mass %, and more preferably 10 to 90 mass % relative to the whole adhesive composition.

<Coupling Agent>

To the adhesive composition according to the embodiment, a coupling agent can be added. Examples of the coupling agent to be used include, but are not particularly limited to, various coupling agents such as a silane coupling agent, a titanate coupling agent, an aluminum coupling agent, a zirconate coupling agent and a zircoaluminate coupling agent.

Examples of the silane coupling agent include methyltrimethoxysilane, methyltriethoxysilane, phenyltrimethoxysilane, phenyltriethoxysilane, vinyltrimethoxysilane, vinyltriethoxysilane, vinyltriacetoxysilane, vinyl-tris(2-methoxyethoxy)silane, γ-methacryloxytrimethoxysilane, γ-methacryloxypropylmethyl dimethoxysilane, methyltri (methacryloxyethoxy)silane, γ-acryloxypropyltrimethoxysilane, γ-aminopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane, N-β-(N-vinylbenzylaminoethyl)-γ-aminopropyltrimethoxysilane, γ-anilinopropyltrimethoxysilane, γ-ureidopropyltrimethoxysilane, γ-ureidopropyltriethoxysilane, 3-(4,5-dihydroimidazolyl)propyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropylmethyldiisopropenoxysilane, methyltriglycidoxysilane, γ-mercaptopropyltrimethoxysilane, γ-mercaptopropyltriethoxysilane, γ-mercaptopropylmethyldimethoxysilane, trimethylsilylisocyanate, dimethylsilylisocyanate, phenylsilyltriisocyanate, tetraisocyanatesilane, methyl silyltriisocyanate, vinylsilyltriisocyanate and ethoxysilanetriisocyanate.

Examples of the titanate coupling agent include isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl-1-butyl)bis(ditridecyl)phosphite titanate, bis(dioctylpyrophosphate)oxyacetate titanate, bis(dioctylpyrophosphate) ethylene titanate, isopropyltrioctanoyl titanate, isopropyldimethacrylisostearoyl titanate, isopropyl(dioctylphosphate) titanate, isopropyltricumylphenyl titanate, isopropyltri(N-aminoethylaminoethyl) titanate, dicumylphenyloxyacetate titanate and diisostearoylethylene titanate.

Examples of the aluminum coupling agents include acetoalkoxyaluminum diisopropionate.

Examples of the zirconate coupling agents include tetrapropyl zirconate, tetrabutyl zirconate, tetra(triethanolamine) zirconate, tetraisopropyl zirconate, zirconium acetylacetonateacetylacetonezirconium butyrate, and stearic acid zirconium butyrate.

Examples of the zircoaluminate coupling agent include the compounds represented by the following formula (19):

[Chemical Formula 10]

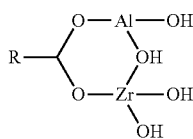

(19)

(In the formula (19), R represents a carboxyl group or an amino group.)

Examples of the compound where R represents a carboxyl group include Manchem CPG-carboxy zircoaluminate. Examples of the compound where R represents an amino group include a Manchem APO-X-amino zircoaluminate solution. They are each available from Rhone-Poulenc Inc.

The blending amount of a coupling agent relative to 100 parts by mass of the total amount of the adhesive composition excluding a solvent is preferably 0.1 to 20 parts by mass and particularly preferably 1 to 15 parts by mass. If the blending proportion is 0.1 part by mass or more, adhesive strength tends to improve. In contrast, if the blending proportion is 20 parts by mass or less, the content of a volatile matter is lower and voids tend to be rarely formed in the cured product.

Among these coupling agents, it is preferable to select a silane coupling agent since it is effective in improving coupling of materials at the interface or wettability.

<Filler>

To the adhesive composition according to the embodiment, if necessary, a filler may be added. Types of fillers include an inorganic filler, an organic filler, etc. In order to improve heat-resistant or thermal conductivity, or control melt viscosity or provide thixotropy, an inorganic filler is preferable.

Examples of the inorganic filler include, but are not particularly limited to, aluminum hydroxide, magnesium hydroxide, calcium carbonate, magnesium carbonate, calcium silicate, magnesium silicate, calcium oxide, magnesium oxide, aluminum oxide, aluminum nitride, titanium oxide, zirconium oxide, cerium oxide, zinc oxide, aluminum borate whisker, boron nitride, crystalline silica, amorphous silica and antimony oxide, and these can be used alone or in combination of two or more.

In order to improve thermal conductivity, aluminum oxide, aluminum nitride, boron nitride, crystalline silica, amorphous silica, etc., are preferable. To control melt viscosity or provide thixotropy, aluminum hydroxide, magnesium hydroxide, calcium carbonate, magnesium carbonate, calcium silicate, magnesium silicate, calcium oxide, magnesium oxide, aluminum oxide, crystalline silica, amorphous silica, etc., are preferable.

In order to improve transparency and workability, it is preferable that the blending amount of filler is 3 mass % or less of the total adhesive composition excluding a solvent.

<Binder Resin>

The adhesive composition according to the embodiment, if necessary, further may comprise a binder resin. Examples of the binder resin include an acrylic polymer, an epoxy resin, a urethane resin and a polyimide resin. In order to improve transparency, an acrylic polymer is preferable as the binder resin and (f) an acrylic polymer having a weight-average molecular weight of 100000 or more is more preferable.

The acrylic polymer to be used in the embodiment refers to a polymer constituted of a single acrylic monomer having a single (meth)acryloyl group in a molecule or a copolymer constituted of two types or more acrylic monomers having a single (meth)acryloyl group in a molecule. Note that as long as the effects of the invention are not impaired, a copolymer obtained by copolymerizing a compound which has two or more (meth)acryloyl groups in a molecular or a polymerizable compound having no (meth)acryloyl group (a compound having a single polymerizable unsaturated bond in a molecule, such as acrylonitrile, styrene, vinyl acetate, ethylene, propylene or a compound having two or more polymerizable unsaturated bonds in a molecule, such as divinylbenzene) with an acrylic monomer. In view of this, the acrylic polymer to be used in the embodiment contains an acrylic monomer having a single (meth)acryloyl group in a molecule preferably in an amount of 30 to 100 mass % and more preferably in an amount of 50 to 100 mass % based on the total amount of acrylic polymer.

According to the embodiment, it is preferable that the acrylic polymer having a weight-average molecular weight of 100000 or more contains a structural unit having a functional group. Owing to the content of the structural unit having a functional group, more excellent stress relaxation due to low elastic modulus, crack resistance, adhesiveness and heat-resistance can be exerted.

A method for introducing a functional group into an acrylic polymer is not particularly limited; a functional group can be introduced into an acrylic polymer by random copolymerization of a functional group-containing monomer (containing a functional group) by a suspension polymerization such as bead polymerization, granular polymerization and pearl polymerization as well as a conventional method such as solution polymerization, bulk polymerization, precipitation polymerization and emulsion polymerization. Of them, it is preferable to employ a suspension polymerization method for the reason that polymerization can be made at low cost.

The suspension polymerization is carried out in an aqueous solvent by adding a suspension agent. Examples of the suspension agent include water-soluble polymers such as polyvinyl alcohol, methyl cellulose and polyacrylamide and less-soluble inorganic substances such as calcium phosphate and magnesium pyrophosphate. Of them, a non-ionic water-soluble polymer such as polyvinyl alcohol is preferable. This is because when the non-ionic water-soluble polymer is used, ionic impurities are less likely to remain in the resultant acrylic copolymer. It is preferable that the water-soluble polymer is used in an amount of 0.01 to 1 part by mass relative to the total amount 100 parts by mass of the monomers.

In a polymerization reaction, a general polymerization initiator, a general chain transfer agent, etc., may be used. Examples of the polymerization initiator include the same polymerization initiators or photopolymerization initiators as mentioned in the above section of the (b) thermal polymerization initiator. Examples of the chain transfer agent include thiols such as n-octyl mercaptan.

It is preferable that the functional group-containing monomer has at least one functional group selected from the group consisting of a carboxyl group, an acid anhydride group, a hydroxyl group, an amino group, an amide group, a phosphate group, a cyano group, a maleimide group and an epoxy group in a molecule, and at least one polymerizable carbon-carbon double bond.

It is preferable that the functional group is at least one group selected from the group consisting of an amino group, an amide group, a phosphate group, a cyano group, a maleimide group and an epoxy group in order to avoid problems such as gelation in a varnish state, clogging of a nozzle, etc., when used and occurrence of pinholes during spin coating. It is preferable that the functional group is at least one group selected from the group consisting of a carboxyl group, an acid anhydride group, a hydroxyl group, a phosphate group and an epoxy group in order to more highly prevent coloring. From both points of view, the functional group is more preferably a phosphate group or an epoxy group and further preferably an epoxy group.

Examples of the functional group-containing monomer that can be used include cyano group-containing monomers such as cyano norbornyl (meth)acrylate; carboxyl group-containing monomers such as (meth)acrylic acid and itaconic acid; acid anhydride group-containing monomers such as maleic anhydride acid; hydroxyl group-containing monomers such as 2-hydroxymethyl (meth)acrylate, 2-hydroxyethyl (meth)acrylate, 2-hydroxypropyl (meth)acrylate, N-methylol (meth)acrylamide, o-hydroxystyrene, m-hydroxystyrene and p-hydroxystyrene; amino group-containing monomers such as diethylaminoethyl (meth)acrylate; phosphoric acid group-containing monomers such as 2-(meth)acryloyloxyethyl acid phosphate; vinyl cyanide compounds such as (meth)acrylonitrile; N-substituted maleimides such as N-methylmaleimide, N-ethylmaleimide, N-propylmaleimide, N-i-propylmaleimide, N-butylmaleimide, N-i-butylmaleimide, N-t-butylmaleimide, N-laurylmaleimide, N-cyclohexylmaleimide, N-benzylmaleimide and N-phenylmaleimide; and epoxy group-containing monomers such as glycidyl (meth)acrylate, glycidyl α-ethylacrylate, glycidyl α-n-propylacrylate, 3,4-epoxybutyl (meth) acrylate, 4,5-epoxypentyl (meth)acrylate, 6,7-epoxyheptyl (meth)acrylate, 3-methyl-3,4-epoxybutyl (meth)acrylate, 4-methyl-4,5-epoxypentyl (meth)acrylate, 5-methyl-5,6-epoxyhexyl (meth)acrylate, β-methylglycidyl (meth)acrylate and β-methylglycidyl α-ethylacrylate. These can be used alone or in combination of two or more.

Of them, an epoxy group-containing monomer such as glycidyl (meth)acrylate can be particularly preferably used. A polymer obtained by using such a monomer, for example, a glycidyl group-containing (meth)acrylic polymer, is preferable to be compatible with an acrylic monomer or oligomer. The glycidyl group-containing (meth)acrylic polymer may be synthesized by a conventional method or may be a commercially available compound. Examples of the commercially available compound include HTR-860P-3 (trade name, Nagase ChemteX Corporation). Such an acrylic polymer is preferable since more excellent crack resistance, adhesiveness and heat-resistance are exerted and storage stability can be ensured.

The amount of a structural unit having a functional group as mentioned above based on the total amount of an acrylic polymer is preferably 0.5 to 6.0 mass %, more preferably 0.5 to 5.0 mass % and particularly preferably 0.8 to 5.0 mass %. If the amount of a structural unit having a functional group falls within the range, adhesive force can be improved; at the same time, gelation can be suppressed.

Examples of the monomers to be used in synthesizing the acrylic polymer according to the embodiment other than the functional group-containing monomers to be used in synthesizing the acrylic polymer according to the embodiment include (meth)acrylic acid esters such as methyl (meth) acrylate, ethyl (meth)acrylate, n-propyl (meth)acrylate, i-propyl (meth)acrylate, n-butyl (meth)acrylate, i-butyl (meth)acrylate, t-butyl (meth)acrylate, pentyl (meth)acrylate, n-hexyl (meth)acrylate, 2-ethylhexyl (meth)acrylate, n-octyl (methacrylate, dodecyl (meth)acrylate, octadecyl (meth)acrylate, butoxyethyl (meth)acrylate, phenyl (meth) acrylate, benzyl (meth)acrylate and naphthyl (meth)acrylate; aromatic vinyl compounds such as α-methylstyrene, α-ethylstyrene, α-fluorostyrene, α-chlorostyrene, α-bromostyrene, fluorostyrene, chlorostyrene, bromostyrene, methylstyrene, methoxystyrene and styrene; and alicyclic monomers such as cyclopentyl (meth)acrylate, cyclohexyl (meth)acrylate, methylcyclohexyl (meth)acrylate, trimethylhexyl (meth)acrylate, norbornyl (meth)acrylate, norbornylmethyl (meth)acrylate, phenylnorbornyl (meth)acrylate, isobornyl (meth)acrylate, bornyl (meth)acrylate, menthyl (meth)acrylate, fenchyl (meth)acrylate, adamantyl (meth) acrylate, tricyclo[5.2.1.0$^{2,6}$]deca-8-yl (meth)acrylate, tricyclo[5.2.1.0$^{2,6}$]deca-4-methyl (meth)acrylate and cyclodecyl (meth)acrylate. These can be used alone or in combination of two or more.

Of these, (meth)acrylic acid esters are preferably used because they easily synthesize a component (f) having a weight-average molecular weight of 100000 or more without gelation. Of the (meth)acrylic acid esters, ethyl (meth) acrylate, butyl (meth)acrylate and 2-ethylhexyl (meth)acrylate are further preferably used because it can be excellently copolymerized with a functional group-containing monomer.

It is preferable that the component (f) contains a structural unit having an alicyclic or heterocyclic structure. Examples of the monomer having an alicyclic or heterocyclic structure for use in producing an acrylic polymer having a structural unit having an alicyclic or heterocyclic structure include the compounds represented by the following formula (1):

[Chemical Formula 11]

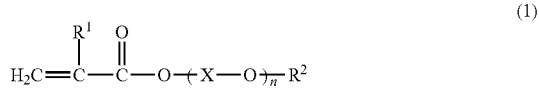

(1)

(In the formula (1), $R^1$ represents a hydrogen atom or a methyl group; $R^2$ represents an alicyclic group or a heterocyclic group; X represents an alkylene group having 1 to 6 carbon atoms; and n represents an integer of 0 to 10. If n represents an integer of 2 or more, a plurality of X may be mutually the same or different. The alicyclic group herein represents a group having a structure in which carbon atoms are circularly bound; and the heterocyclic group represents a group having a structure in which carbon atoms and 1 or more hetero atoms are circularly bound.)

Examples of $R^2$ include the compounds represented by the following formula (2).

[Chemical Formula 12]

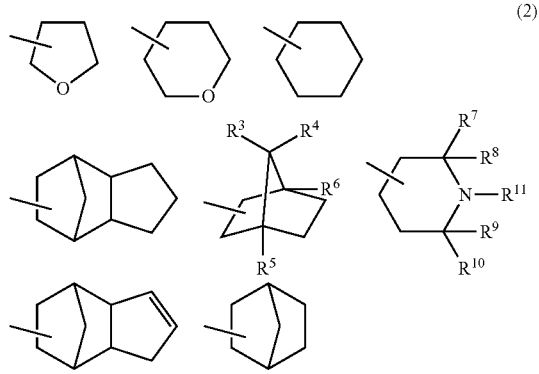

(2)

(In the formula (2), $R^3$, $R^4$, $R^5$, $R^6$, $R^7$, $R^8$, $R^9$ and $R^{10}$ each independently represent a hydrogen atom or an alkyl group having 1 to 4 carbon atoms; and $R^{11}$ represents a hydrogen atom, an alkyl group having 1 to 4 carbon atoms or a structure represented by $OR^{12}$, in which $R^{12}$ represents a hydrogen atom or an alkyl group having 1 to 8 carbon atoms.)

Examples of the compound represented by a general formula (1) include cyclohexyl (meth)acrylate, isobornyl (meth)acrylate, tricyclo[5.2.1.0$^{2,6}$]decyl (meth)acrylate, dicyclopentanyl (meth)acrylate and dicyclopentenyl (meth)acrylate.

The content of each of these monomers other than the functional group-containing monomers is not particularly limited; however, the content is preferably controlled such that Tg of the component (f) to be used in the adhesive composition according to the embodiment falls within the range of −50 to 50° C. For example, if 2.5 mass % of glycidyl methacrylate, 43.5 mass % of methyl methacrylate, 18.5 mass % of ethyl acrylate and 35.5 mass % of butyl acrylate are used as monomers, an epoxy group-containing acrylic polymer having a Tg of 12° C. and a weight-average molecular weight of 100000 or more, serving as the component (f) can be synthesized.

When a functional group-containing monomer is used in combination, the mixing ratio thereof is determined in consideration of Tg of an acrylic polymer. The Tg is preferably −50° C. or more. If Tg is −50° C. or more, the tackiness of the adhesive composition in a B-stage state is appropriate and a problem is rarely produced in handling. In view of this, the mixing ratio of the functional group-containing monomer and the monomer except the functional group-containing monomer is preferably 100:0 to 0.1:99.9 and more preferably 100:0 to 1:99.

When an acrylic polymer containing a structural unit having a functional group and having a weight-average molecular weight of 100000 or more is produced by polymerizing the aforementioned monomer, a polymerization method thereof is not particularly limited and methods such as pearl polymerization, solution polymerization and suspension polymerization can be used.

The weight-average molecular weight of the acrylic polymer is preferably 120000 to 3000000 and more preferably 120000 to 2000000. If the weight-average molecular weight falls within the range, when the acrylic polymer is formed into a sheet or film, the sheet or film will have appropriate strength, flexibility and tackiness. In addition, since the polymer has appropriate flowability, it can be sufficiently filled in a wiring circuit. Note that, in the embodiment, the weight-average molecular weight is measured by gel permeation chromatography (GPC) as described in Examples and represented by a value converted based on the standard polystyrene calibration curve.

The use amount of the acrylic polymer component containing a structural unit having a functional group and having a weight-average molecular weight of 100000 or more relative to 100 parts by mass of the above (a) compound having at least two ethylenically unsaturated groups is preferably 10 to 400 parts by mass. If the use amount falls within the range, more preferable storage elastic modulus is exhibited, flowability during molding can be suppressed and handling at high temperature can be improved. From these points of view, the use amount is more preferably 15 to 350 parts by mass and particularly preferably 20 to 300 parts by mass.

When a varnish is produced by adding a filler to the adhesive composition according to the embodiment, the vanish is sufficiently dispersed by applying physical shearing force by a means such as a grinder, 3-rolls, a ball mill and a bead mill so as not to remain secondary agglomerated particles, and then put in use. The aforementioned dispersion methods can be used in combination.

The duration of mixing components can be reduced by previously mixing a filler and a low molecular weight substance(s) and then adding a high molecular weight substance(s) to the mixture.

Example of a method of homogeneously stirring and mixing individual components include, but are not particularly limited to, a method of using a rotation revolution stirrer such as a dissolver, a static mixer, a homogenizer, an ultrasonic homogenizer, a paint shaker, a ball mill, a planetary mixer, a mixing rotor and a universal agitator, and a method of using a kneader such as a stone-mill and 3-rolls. These methods can be appropriately used in combination. After a mixture is obtained in a state like a varnish, it is preferable to remove air bubbles in the vanish-like mixture. In view of this, the rotation revolution stirrer, which simultaneously carries out mixing, dissolution and removal of air bubbles, is preferably employed.

To the adhesive composition according to the embodiment, if necessary, a curing retarder, a hindered amine based light stabilizer, a UV absorber, an inorganic filler, an organic filler, a coupling agent, a tackifier, a polymerization inhibitor, a plasticizer, a mold release agent, an antistatic agent and a flame retardant may be appropriately added alone or in combination of several types.

To the adhesive composition according to the embodiment, if necessary, further a hygroscopic agent such as calcium oxide and magnesium oxide; a wettability improving agent such as a fluorine-containing surfactant, a nonionic surfactant and a higher fatty acid; a defoamer such as silicone oil; and an ion trapping agent such as an inorganic ion exchanger may be appropriately added alone or in combination of several types of agents.

When the adhesive composition according to the embodiment is used, an adhesive layer is formed on a first workpiece, and a second workpiece is bonded and curing is performed to obtain a cured-resin product. At that time, since the physical properties of the cured-resin product has a large effect upon the reliability of electronic parts, it is preferable that curing is made by polymerization of the adhesive composition as much as possible.

<Method for Manufacturing a Semiconductor Device>

The method for manufacturing a semiconductor device according to the embodiment, comprises a step of forming an adhesive layer (hereinafter referred to also as "adhesive resin layer") of the aforementioned adhesive composition according to the embodiment on a semiconductor substrate (adhesive layer formation step); a step of sandwiching the adhesive layer by the semiconductor substrate and a transparent substrate and applying pressure onto the semiconductor substrate and the transparent substrate for bonding (press-bonding step); and a step of curing the adhesive layer (curing step).

(Adhesive Layer Formation Step)

For the adhesive layer formation step, a method of applying the adhesive composition according to the embodiment onto a semiconductor substrate or a method of attaching an adhesive composition in a film form to a semiconductor substrate can be employed. The semiconductor substrate is either one of a semiconductor wafer and a semiconductor device (semiconductor chip).

As the method of applying the adhesive composition, e.g., a dispensing method, a spin coating method, die coating method and a knife coating method may be mentioned. In particular, a spin coat method or a die coating method, which is suitable for application of the composition comprising a high molecular weight compound is preferable.

When the method of attaching an adhesive composition in a film form is employed, in order to ensure sufficient wetting and spreading thereof, it is preferable to laminate the adhesive composition in a film form within the range of 0 to 90° C. To uniformly bond the adhesive composition in a film form, it is preferable to employ lamination by use of a roll.

A method of producing an adhesive composition in a film form will be described below. The adhesive composition according to the embodiment is uniformly applied to a support film and heated in the conditions in which the solvent used herein is sufficiently volatilized, for example, at a temperature of 60 to 200° C. for 0.1 to 30 minutes, to form the adhesive composition in a film form. At this time, in order to obtain an adhesive composition in a film form having a desired thickness, the amount of solvent in the adhesive composition, viscosity thereof, the initial thickness of the coating (when a coater such as a die coater and a comma coater is used, the gap between the coater and a support film is controlled), drying temperature and air flow, etc., are controlled.

It is preferable that the support film is flat. Since a support film such as a PET film has highly adhesive due to static attraction, a smoothing agent is sometimes used in order to improve workability. Depending upon the type of smoothing agent and temperature, minor projections and depressions are transferred to the adhesive and the degree of flatness may sometimes decrease. Accordingly, it is preferable to use a support film to which a smoothing agent is not applied or a support film having a low amount of smoothing agent applied. A support film such as a polyethylene film is preferable in view of excellent flexibility; however, the thickness and density of the support film is appropriately selected such that marks of a roll, etc., used in lamination are not transferred to the surface of a light sensitive adhesive layer.

(Press-Bonding Step)

In the next step, the adhesive layer formed on the semiconductor substrate, if desired, heated and dried. The drying temperature is not particularly limited. If components are dissolved or dispersed in a solvent to prepare a mixture like a varnish, it is preferable that the drying temperature is lower by 10 to 50° C. than the boiling point of the solvent used herein. This is preferable because the solvent is not bubbled during drying and air bubbles are not formed. For the reason, the drying temperature is lower more preferably by 15 to 45° C. and further preferably by 20 to 40° C. than the boiling point of the solvent to be used.

In the case where components are dissolved or dispersed in a solvent to prepare a mixture like varnish, it is particularly preferable that the remaining amount of solvent is reduced as much as possible because formation of air bubbles due to bubbling of the solvent after curing is avoided.

The duration of heat-drying is not particularly limited as long as the solvent used there is sufficiently volatilized and the component (b) does not substantially generate radicals. The heat-drying is usually performed by heating at 40 to 100° C. for 0.1 to 90 minutes. Note that, the phrase "does not substantially generate radicals" means that no radicals are generated or means that if radicals are generated, the amount of radicals is extremely low enough to prevent proceeding of a polymerization reaction or even if a polymerization reaction proceeds, the physical properties of the adhesive layer are not affected. It is preferable that drying is carried out under reduced pressure, because radical generation from the component (b) by heating is suppressed as well as the remaining amount of the solvent can be reduced.

In order to suppress peeling of the adhesive layer during a solder-reflow process due to bubbles generated during heat-curing of the adhesive layer, it is preferable to sufficiently reduce the amount of volatile components present within or on the adhesive layer, such as a residual solvent, low molecular weight impurities, a reaction product(s), a decomposition product(s), a water derived from materials and water adsorbed to a surface.

After the heat-drying, a transparent substrate is bonded onto the adhesive layer by application of pressure.

Note that, the heat-drying can be omitted when a method of bonding an adhesive composition in a film form is employed in the adhesive layer formation step.

(Curing Step)

After the semiconductor substrate and the transparent substrate are bonded by application of pressure with the adhesive layer interposed between them, the adhesive layer is cured. As a curing method, curing with application of heat is preferable.

In the curing step of forming a cured product of the adhesive layer, it is preferable that curing is performed for one to two hours while selecting temperature and increasing temperature step by step. It is preferable that the curing is performed within the range of 100 to 200° C.

Note that, it is not necessary that the press-bonding step and curing step are independent steps. Curing can be simultaneously carried out while press-bonding.

<Physical Properties of Cured Product of Adhesive Layer>

The Tg of the cured product of the adhesive layer according to the embodiment having the aforementioned composition is preferably −10° C. or more and more preferably 0° C. or more.

The elastic modulus at 25° C. of the cured product of the adhesive layer according to the embodiment is preferably 0.01 GPa or more, more preferably 0.1 GPa or more and further preferably 0.5 GPa or more. Note that, the upper limit of the elastic modulus at 25° C., which is not particularly limited, is preferably 10 GPa or less from a practical point of view.

<Optical Parts>

The optical parts according to the embodiment have a non-cavity structure using the aforementioned adhesive composition. Now, the backside-illuminated structure of a solid-state imaging element, will be described as an example of the optical parts according to the embodiment, if necessary, referring to the accompanying drawings.

FIG. 1 is a plan view showing a solid-state imaging element according to the embodiment. As shown in FIG. 1, a CMOS image sensor 1 according to the embodiment has a sensor section 3 (also referred to as a "light receiving section 3") having a plurality of microlenses 12 arranged therein, at a center region. Around the sensor section 3, a peripheral circuit section 4 is present, in which a circuit is formed. Further, a glass substrate 5 is provided so as to cover at least the sensor section 3.

Figure 2:
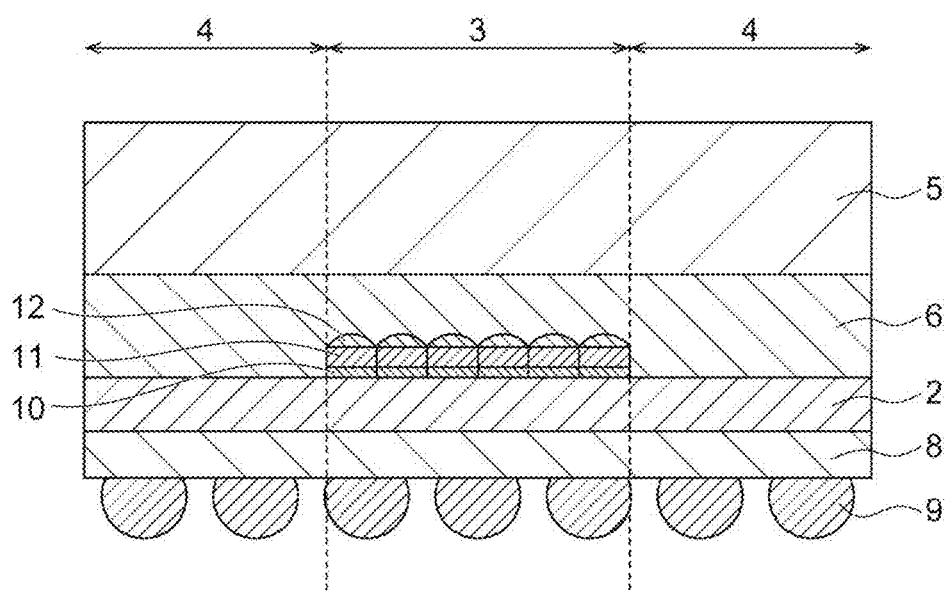
FIG. 2 is a sectional view along the A-N line of FIG. 1.

FIG. 2 is a sectional view along the A-A' line of FIG. 1. As shown in FIG. 2, on one of the surfaces of a silicon substrate 2, a plurality of photodiodes 10 are formed. On the upper surface of each of the photodiode 10, a color filter 11 is provided so as to cover at least the photodiode 10. On the upper surface of the color filter 11, a microlens 12 is formed. The color filter 11 is provided to every photodiode 10 and individual microlenses 12 are provided at the positions corresponding to the color filters 11 respectively. An adhesive layer 6 formed of the adhesive composition according to the embodiment is formed over the whole surface of the silicon substrate 2 on which the microlenses 12 are formed. On a surface of the adhesive layer 6, a glass substrate 5 is provided. Likewise, a structure having no cavity portion (non-cavity structure) is formed. On the other surface of the silicon substrate 2, a wiring layer 8 is arranged. On the lower surface of the wiring layer 8, solder balls 9 are provided.

Figure 3:
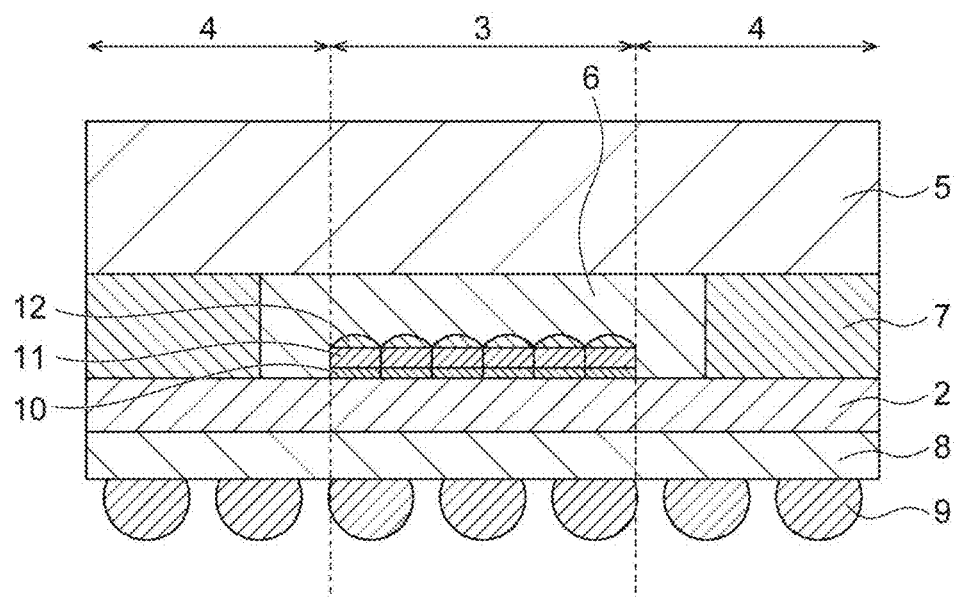
FIG. 3 is a sectional view showing another solid-state imaging element according to the embodiment.

FIG. 3 is a sectional view showing another solid-state imaging element according to the embodiment. In FIG. 3, on the surface of the silicon substrate 2 where the microlenses 12 are provided, a frame-like adhesive layer 7 is provided in the periphery so as not to cover the microlenses 12. On the upper surface of the frame-like adhesive layer 7, the glass substrate 5 is arranged. The portion surrounded by the silicon substrate 2, the frame-like adhesive layer 7 and the glass substrate 5 is filled with the adhesive composition according to the embodiment to form the adhesive layer 6, with the result that a non-cavity structure is formed. In the solid-state imaging element according to the embodiment shown in FIG. 3, the adhesive layer 6 serves not only as an adhesive for bonding the silicon substrate 2 and the glass substrate 5 but also as a sealing material to seal the microlenses 12, color filters 11 and the photodiodes 10 by filling the cavity portion.

In a conventional non-cavity structure, an adhesive rib (hereinafter referred to simply as the "rib") is formed so as to surround a light receiving section, and thereafter, the light receiving section is filled with a transparent sealing material to bond to a transparent substrate (for example, glass) for sealing. In the non-cavity structure shown in FIG. 3, an adhesive rib (the frame-like adhesive layer 7) is formed, and thereafter, the cavity portion is filled with the adhesive composition according to the embodiment to form the adhesive layer 6. In the non-cavity structure manufactured in this manner, other portions except the rib are sufficiently adhesive, with the result that more highly reliable non-cavity structure can be obtained. In contrast, in the non-cavity structure shown in FIG. 2, a rib is not formed and the silicon substrate 2 and the glass substrate 5 having transparency are bonded via the adhesive layer 6 foiled of the adhesive composition according to the embodiment. This is because the adhesive composition according to the embodiment can serve as an adhesive and a sealing material. In this non-cavity structure shown in FIG. 2, compared to the non-cavity structure shown in FIG. 3, formation of a rib is not required and a non-cavity structure can be easily formed. In addition, instruments such as a printer, an exposure machine and a developer required for forming a rib are not required.

Figure 4:
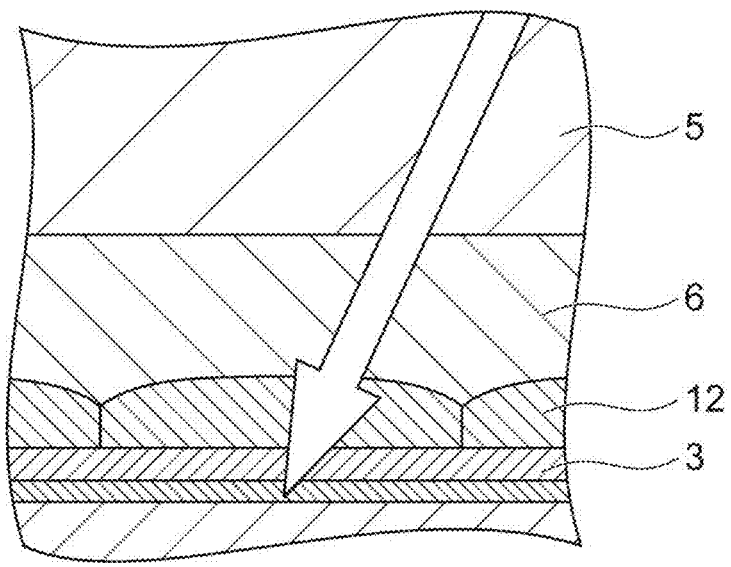
FIG. 4 is a sectional view of a non-cavity structure.
Figure 5:
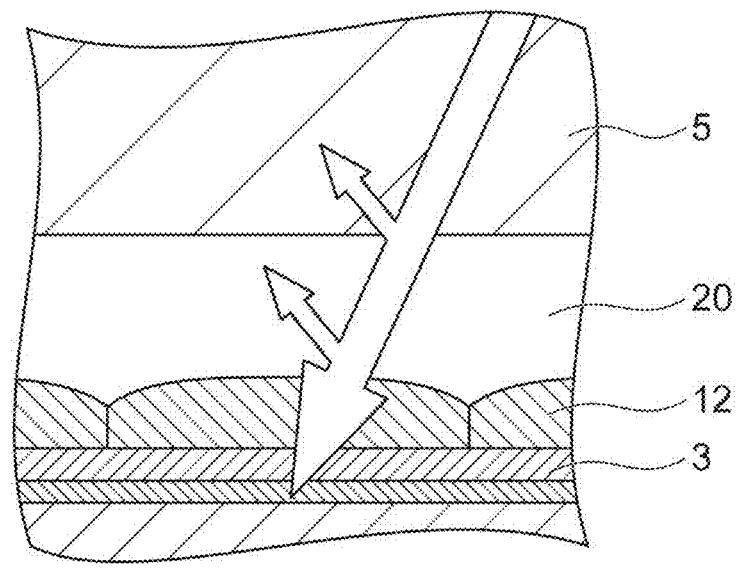
FIG. 5 is a sectional view of a cavity structure.

FIG. 4 and FIG. 5 each illustrates refraction at the interface of cavity portions of a non-cavity structure and a cavity structure, which differ in refractive-index. Assuming that the glass substrate 5 has a refractive index, nD=about 1.47, an air layer 20 of a cavity portion has a refractive index, nD=about 1.00, the microlens 12 has a refractive index, nD=about 1.60, and the adhesive layer 6 has a refractive index, nD=about 1.50, the light loss by interface reflection of the non-cavity structure shown in FIG. 4 is calculated to be lower by about 8% than that of the cavity structure shown in FIG. 5. The refractive index value of the adhesive composition to be used in the embodiment is generally nD=around 1.50.

Figure 6:
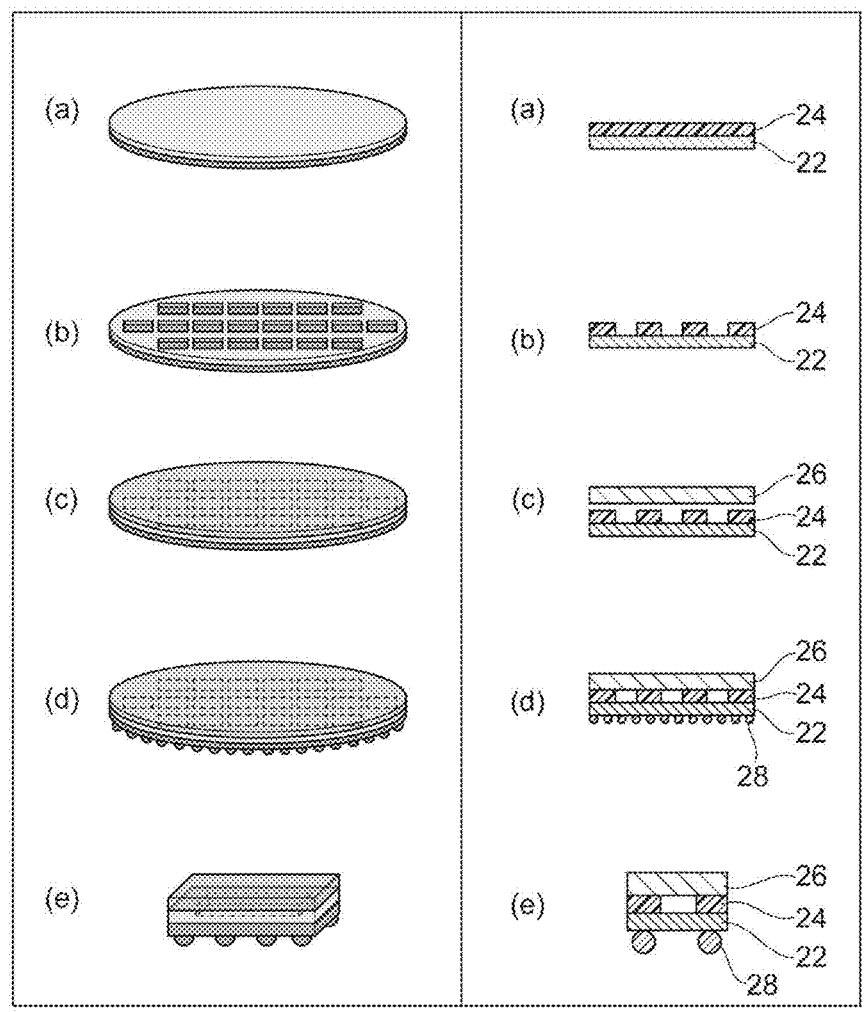
FIG. 6 shows a process drawing illustrating the steps of a method for manufacturing a solid-state imaging element having a cavity structure.
Figure 7:
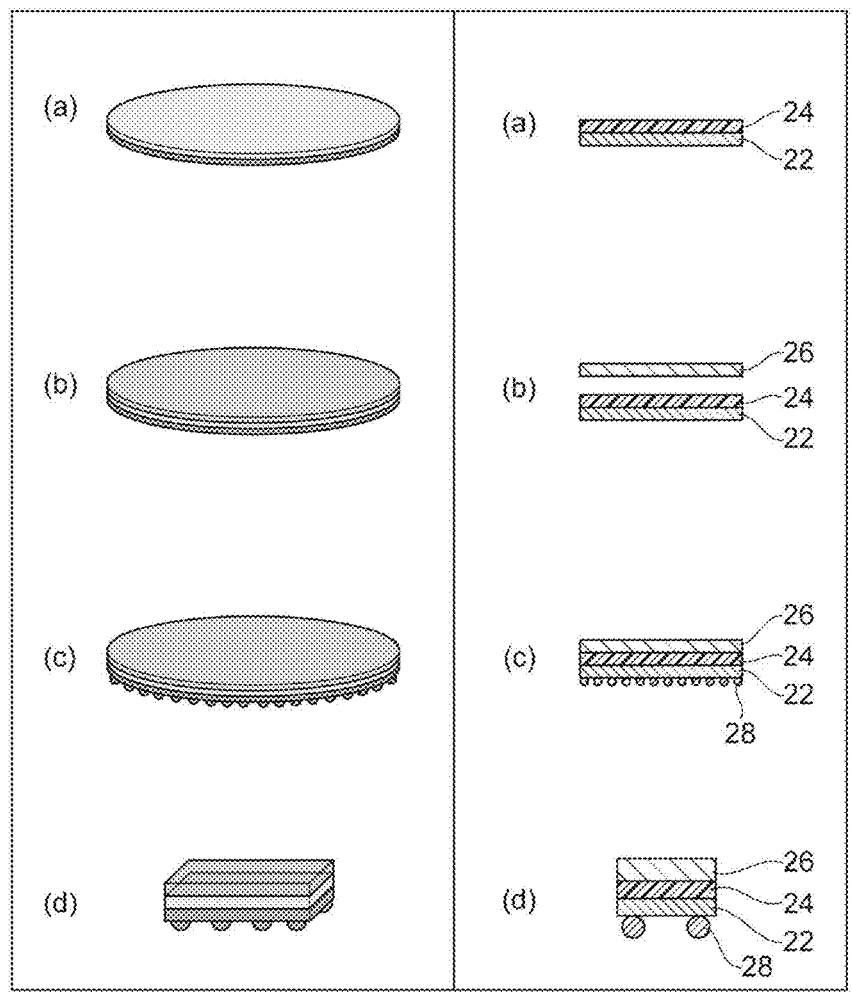
FIG. 7 shows a process drawing illustrating the steps of a method for manufacturing a solid-state imaging element having a non-cavity structure.

Each of FIG. 6 and FIG. 7 is process drawing illustrating the steps of methods for manufacturing solid-state imaging elements having a cavity structure and a non-cavity structure, respectively. In FIG. 6 and FIG. 7, schematic perspective views for individual steps are shown on the left side; whereas the corresponding schematic end views are shown on the right side. In the conventional rib formation process shown in FIG. 6, (a) resin formation (laminate, spin coat), (b) light exposure and development, (c) glass sealing, (d) resin curing and (e) dicing steps are required. To describe more specifically, (a) a resin layer 24 is formed on a substrate 22. (b) The resin layer 24 is exposed to light and developed to form a rib. (c) This was sealed with a glass substrate 26. (d) The resin layer is cured; at the same time, if necessary, back-grinding (BG) processing, formation of through-silicon via (TSV) electrode processing and mounting of the solder balls 28 are performed. (e) The resultant structure is diced to obtain a solid-state imaging element having a cavity structure. In contrast, in the whole surface sealing process shown in FIG. 7, since a rib formation step is not required, the light exposure and development step is not needed. Thus, immediately after an adhesive is formed on a silicon substrate, sealing with a glass substrate can be made. Thereafter, the resultant structure is divided into individual devices by dicing, etc.

In the methods shown in FIG. 6 and FIG. 7, the resin layer 24 is formed on the substrate 22, followed by sealing with the glass substrate 26; however, after the resin layer 24 is formed on the glass substrate 26, sealing with the substrate 22 may be performed.

Examples of a method for manufacturing a solid-state imaging element having a non-cavity structure using the adhesive composition according to the embodiment include methods shown in FIG. 8 to FIG. 15.

Figure 8:
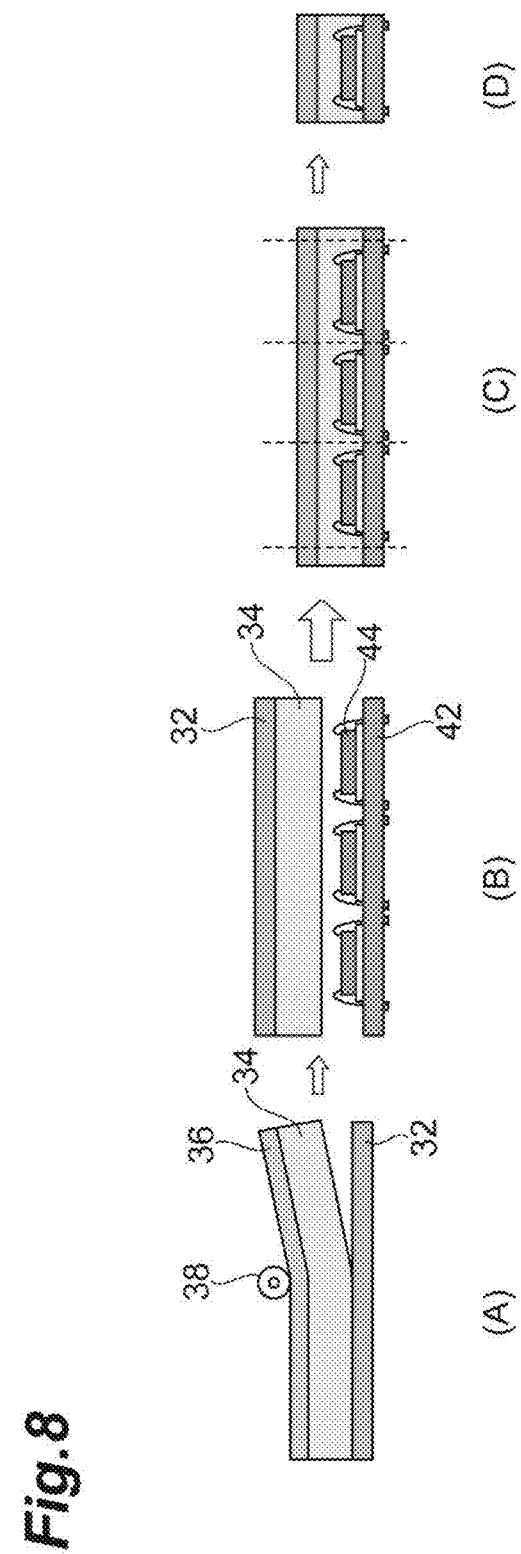
FIG. 8 shows a process drawing illustrating the steps of another method for manufacturing a solid-state imaging element having a non-cavity structure.

FIG. 8 shows a method in which a sheet or film formed of the adhesive composition according to the embodiment, is laminated on a wafer together with the glass substrate and a resin is cured, and then, dicing is carried out. To describe more specifically, (A) an adhesive composition in a film form 34 formed on a support film 36 is bonded onto a glass substrate 32 by use of a roller 38. (B) After the support film 36 is removed, the adhesive composition in a film form 34 having the glass substrate 32 laminated thereon is bonded to a substrate 42 having sensors 44 mounted thereon by applying pressure. (C) This was diced into individual sensors, and then, (D) a solid-state imaging element is obtained.

Note that, in FIG. 8, the method of bonding the adhesive composition in a film form 34 to the glass substrate 32 in advance was explained; however, the adhesive composition in a film form 34 formed on the support film 36 is bonded to the substrate 42 having the sensors 44 mounted thereon by applying pressure, and then the support film 36 is removed and the glass substrate 32 may be bonded by applying pressure.

Figure 9:
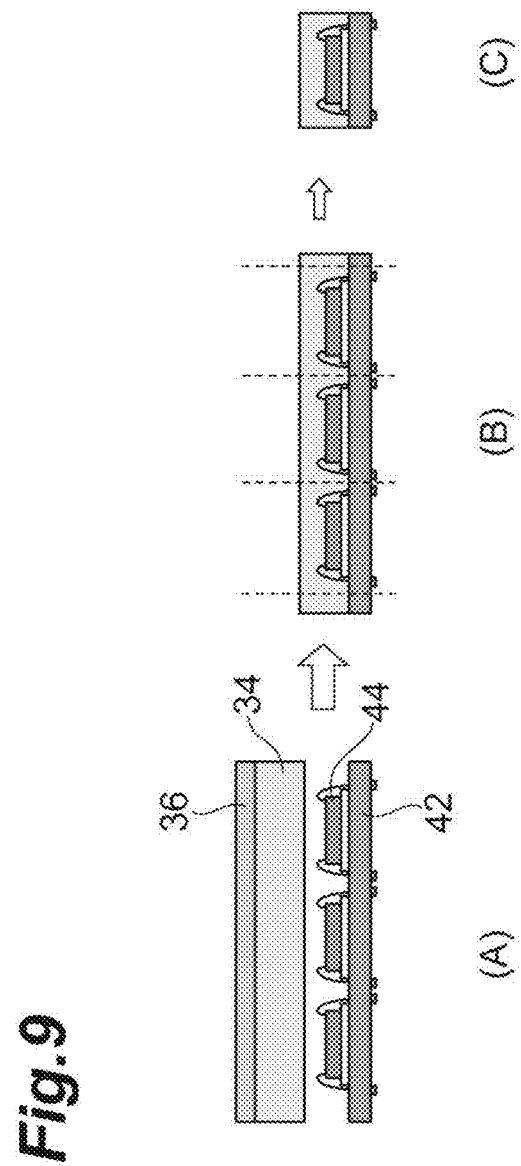
FIG. 9 shows a process drawing illustrating the steps of another method for manufacturing a solid-state imaging element having a non-cavity structure.

The adhesive composition according to the embodiment provides a cured product having high transparency, airtightness and high refractive index. Thus, the adhesive composition serves as a glass substrate in addition to a function as an adhesive. Because of this, as shown in FIG. 9, a solid-state imaging element not sealed with a glass substrate can be manufactured (see FIG. 16).

Figure 10:
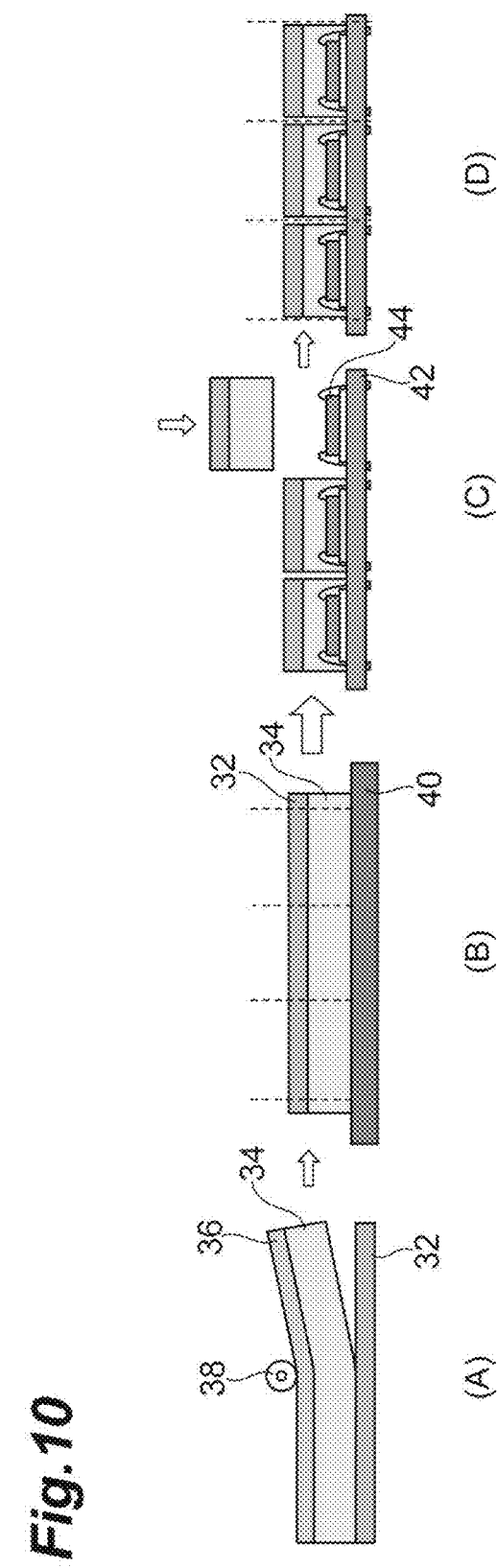
FIG. 10 shows a process drawing illustrating the steps of another method for manufacturing a solid-state imaging element having a non-cavity structure.

Furthermore, a method as shown in FIG. 10 may be employed. More specifically, the adhesive composition in a film form 34 having the glass substrate 32 laminated thereon is separated into pieces on a support base 40 in advance and the individual pieces of the adhesive composition in a film form 34 are laminated on the sensors 44.

Figure 11:
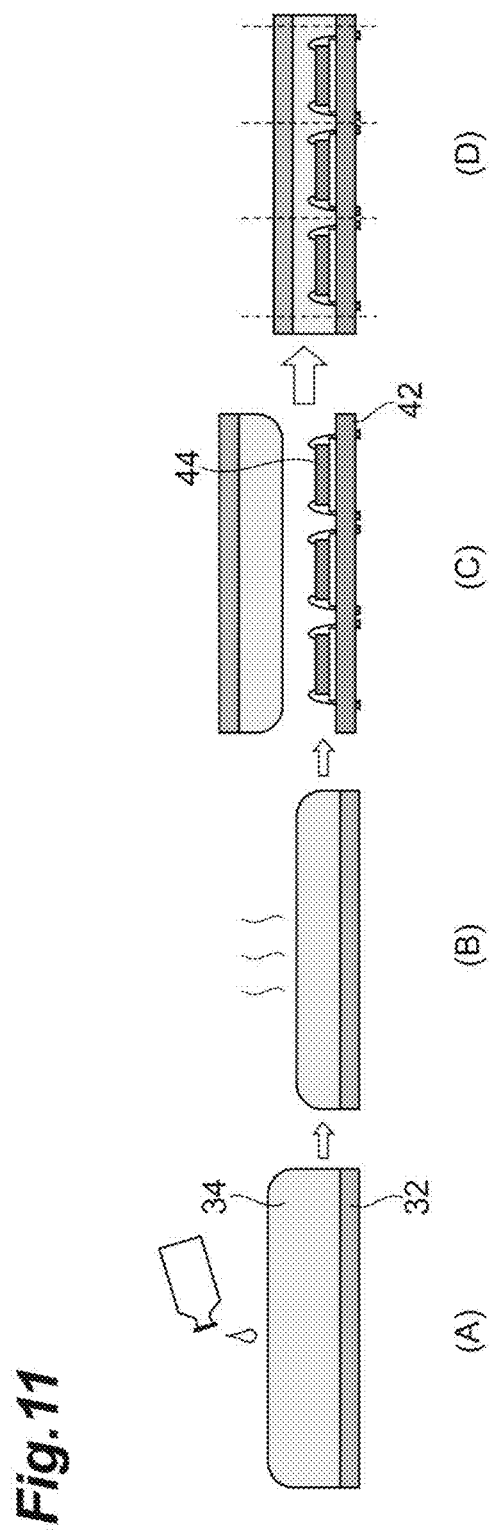
FIG. 11 shows a process drawing illustrating the steps of another method for manufacturing a solid-state imaging element having a non-cavity structure.

In the method shown in FIG. 11, the adhesive composition according to the embodiment in the state of liquid is applied to a glass substrate in accordance with a spin coat method, etc., and converted into the B stage, and then, laminated on a wafer, a resin is cured and the resultant structure is diced. More specifically, (A) the adhesive composition 34 is applied onto the glass substrate 32. (B) This is heated to convert the adhesive composition 34 into the B stage. (C) The adhesive composition 34 in the B stage is bonded to the substrate 42 having the sensors 44 mounted thereon by application of pressure. (D) The resultant structure is diced to obtain solid-state imaging elements.

Figure 13:
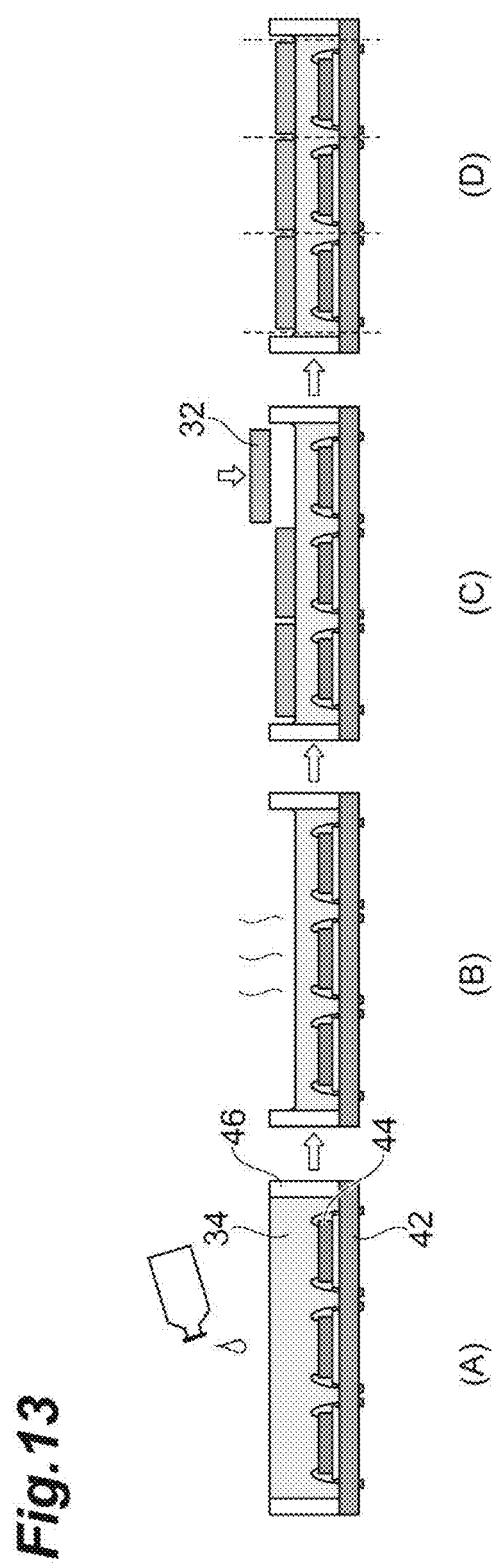
FIG. 13 shows a process drawing illustrating the steps of another method for manufacturing a solid-state imaging element having a non-cavity structure.

Note that, when the adhesive composition is applied, a weir 46 for keeping the adhesive composition 34 to stay on the substrate 42 may be provided in the periphery portion, in the same manner as shown in FIG. 13.

Figure 12:
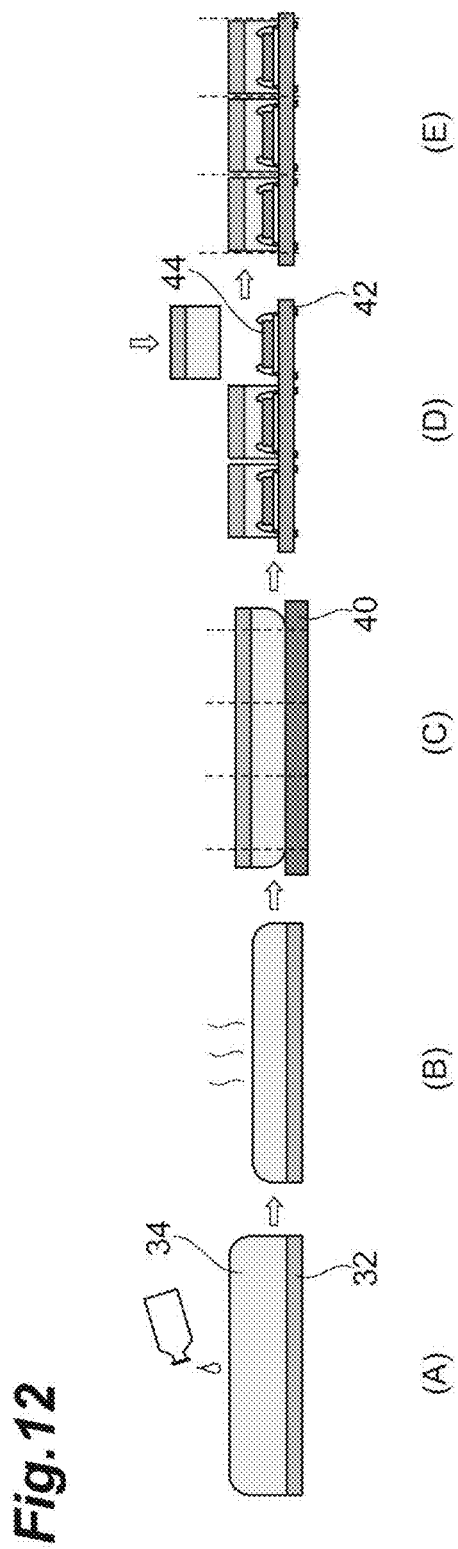
FIG. 12 shows a process drawing illustrating the steps of another method for manufacturing a solid-state imaging element having a non-cavity structure.

As shown in FIG. 12, before lamination on the wafer, the construct consisting of the adhesive composition 34 converted into the B stage and the glass substrate 32 is diced into pieces on the support base 40 in advance, individual pieces of the construction of adhesive composition 34 and the glass substrate 32 may be laminated on the sensors 44.

In the method shown in FIG. 13, the adhesive composition is applied onto a wafer and converted into the B stage on the wafer. The resultant construct is sealed with a glass substrate, a resin is cured and the resultant structure is diced. More specifically, (A) a weir 46 for keeping the adhesive composition 34 is provided on the periphery portion of the substrate 42 having the sensors 44 mounted thereon, and then the adhesive composition 34 is applied. (B) This is heated to convert the adhesive composition 34 into the B stage. (C) The pieces of the glass substrate 32 are mounted on the adhesive composition in the B stage. (D) The resultant structure is diced to obtain solid-state imaging elements.

In the methods shown in FIG. 8 to FIG. 13, the adhesive composition is formed on a wafer and the construct is diced; however, the adhesive composition may be formed on diced chips of a wafer.

Figure 14:
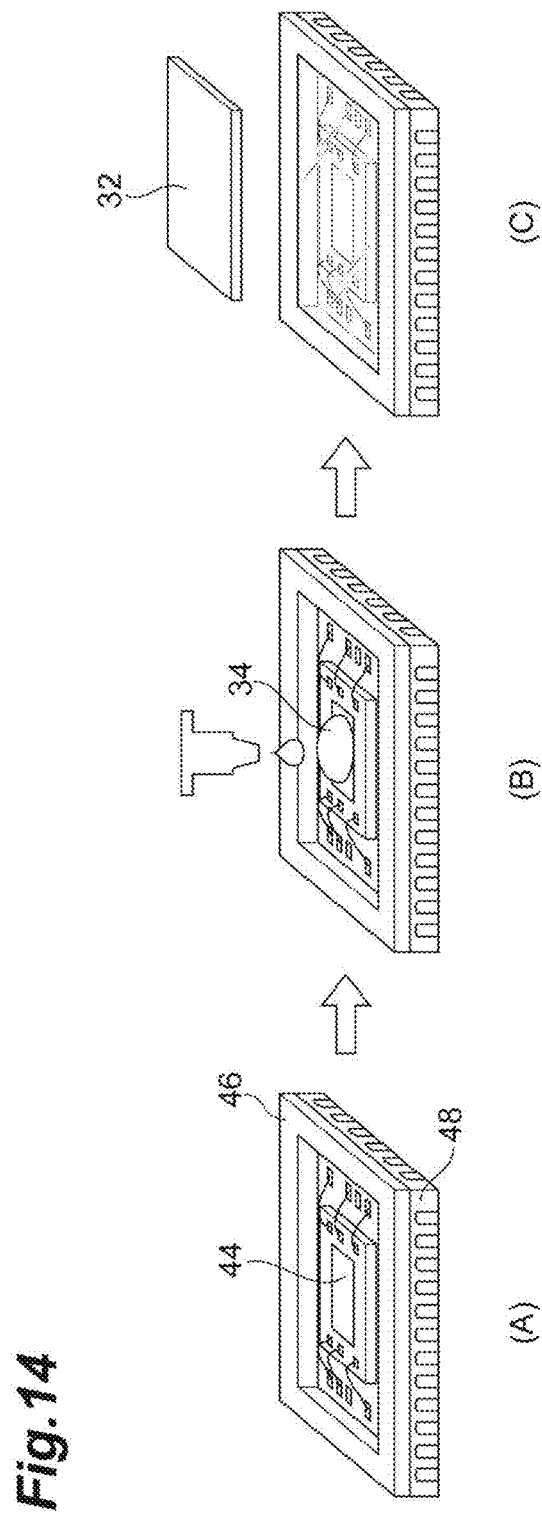
FIG. 14 shows a process drawing illustrating the steps of another method for manufacturing a solid-state imaging element having a non-cavity structure.
Figure 15:
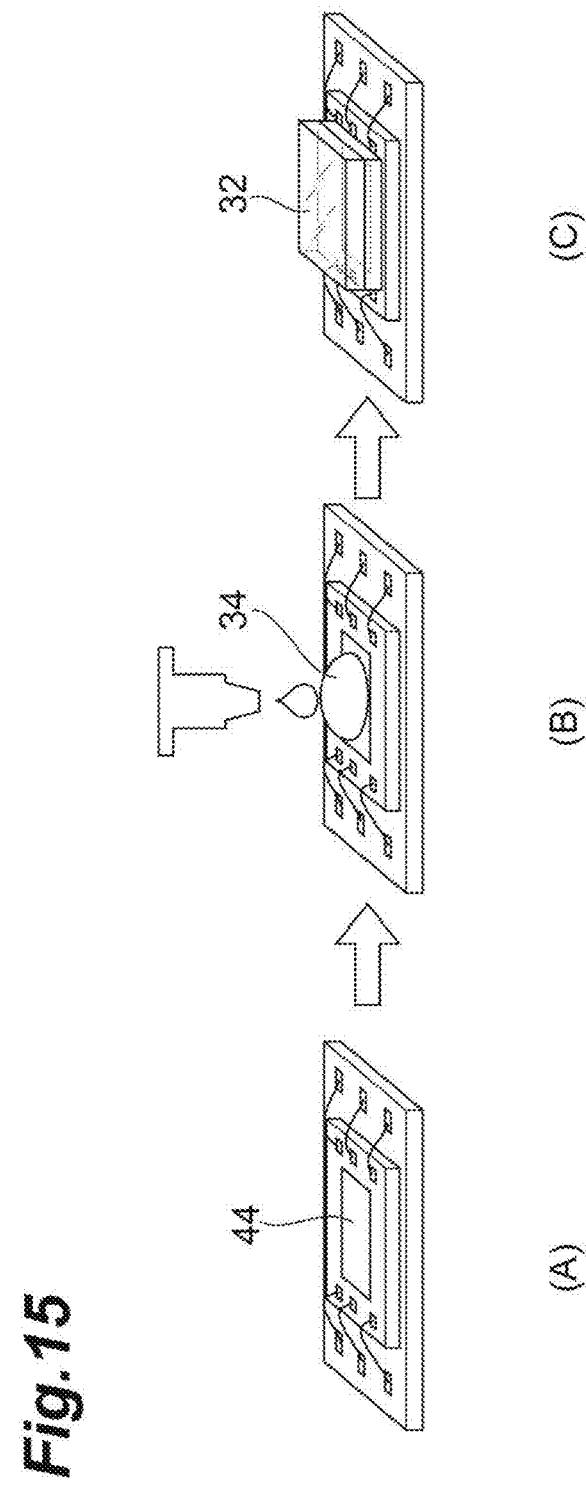
FIG. 15 shows a process drawing illustrating the steps of another method for manufacturing a solid-state imaging element having a non-cavity structure.

FIG. 14 and FIG. 15 show methods of applying a liquid-state adhesive composition onto a chip having a sensor mounted thereon. In FIG. 14, (A) the weir 46 is provided on the periphery portion of a chip 48 having the sensor 44 mounted thereon. (B) The adhesive composition 34 is applied onto the sensor 44. (C) Sealing is made by the glass substrate 32 to obtain a solid-state imaging element.

As shown in FIG. 15, the adhesive composition 34 is applied only to the sensor 44 without providing the weir 46 and then sealing is made by the glass substrate 32.

Note that, in FIG. 14 and FIG. 15, methods of using a liquid-state adhesive composition were described; however, the adhesive composition in a film form can be used similarly to the above.

Figure 17:
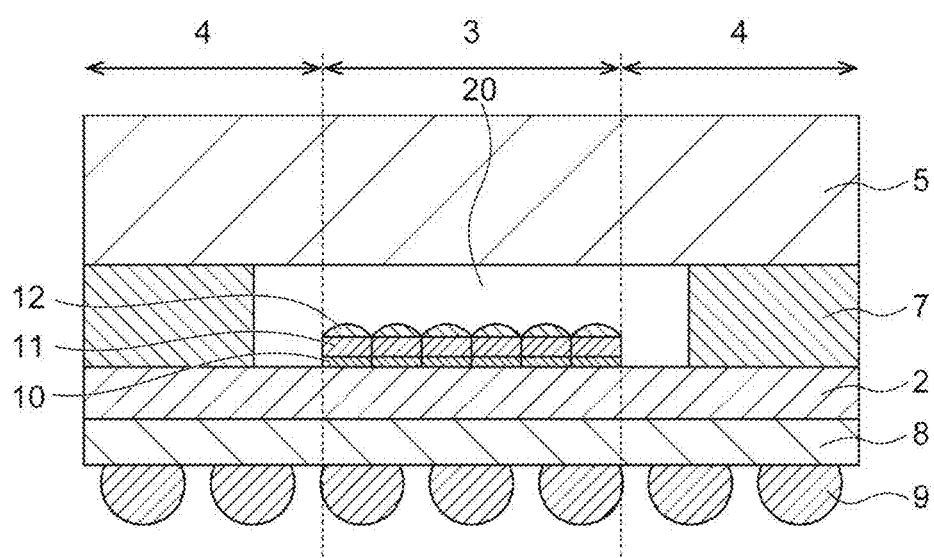
FIG. 17 is a sectional view showing a backside-illuminated solid-state imaging element having a conventional cavity structure.

FIG. 17 is a sectional view showing a backside-illuminated solid-state imaging element having a conventional cavity structure. In FIG. 17, on the silicon substrate 2, a cavity 20 surrounded by a frame-like adhesive layer 7 and the glass substrate 5 is present.

As described, in the conventional cavity structure, a frame-like structure is formed of an adhesive by use of a photolithographic method, a printing method and a dispensing method. Thereafter, it is necessary to bond a glass substrate and a silicon substrate via the obtained frame-like adhesive. Thus, in the cavity structure, the adhesive composition as used in the present invention is not needed; however, an adhesive for forming the frame-like structure is required.

The non-cavity structure using the adhesive composition according to the embodiment has the following merits compared to conventional cavity structures.

In a cavity structure, if a glass substrate has a flaw, image quality may deteriorate due to light scattering, reflection, diffraction, etc. In this regard, such a deterioration in image quality due to a flaw of a glass substrate can be mitigated by employing the non-cavity structure according to the embodiment because interface refractive-index difference decreases and light scattering, reflection, diffraction, etc., are suppressed.

In the cavity structure, deterioration of image quality is caused by foreign matter bonded to microlenses portion, a glass substrate, etc. Foreign matter is attached because a cavity portion is exposed from formation of an adhesive until a glass substrate is bonded thereto. However, attachment of foreign matter can be reduced if the non-cavity structure according to the embodiment is employed because the exposure duration of the cavity portion is reduced and the amount of foreign matter to be bonded is reduced.

In the non-cavity structure, the adhesive layer must be transparent; however, the area at which the adhesive layer and the glass substrate are bonded is large, difference in stress to be applied by the adhesive within an element is low, compared to the cavity structure where a glass substrate is bonded only by a frame-like adhesive layer, with the result that peeling, deformation, etc., of the adhesive are reduced.

In the cavity structure, a beam emitted from glass is received by microlenses. As a result, there is a possibility of reducing the image quality. For the reason, high purity glass, which is usually expensive, must be used. In contrast, in the non-cavity structure according to the embodiment, since a beam can be absorbed by the adhesive layer, the non-cavity structure has an advantage of using inexpensive glass.

The CMOS image sensor according to the embodiment is integrated into, for example, mobile phones. In this case, the CMOS image sensor is integrated in the mother board of a mobile phone via solder balls and optical lenses are arranged in the upper side of the sensor, more specifically, on the side of the glass substrate.

In the foregoing, the embodiment was explained; however, the present invention is not limited to the embodiment. For example, modification can be appropriately made by those skilled in the art by addition or deletion of constitutional structures or change of design, or addition or deletion of a step(s) or change of conditions with respect to the respective embodiments described above. These modifications are included in the scope of the present invention, as long as the modification is not against the gist of the present invention.

For example, if an optical member is manufactured using a liquid-state adhesive composition according to the embodiment, a method of injecting the liquid-state adhesive composition in the space between a wafer or a chip and a glass substrate may be employed.

In the above embodiment, a case where a glass substrate is used as a transparent substrate was described; however, the transparent substrate of the present invention is not limited to this. Any transparent substrate may be used as long as it has necessary strength, rigidity and light transmittance.

Figure 16:
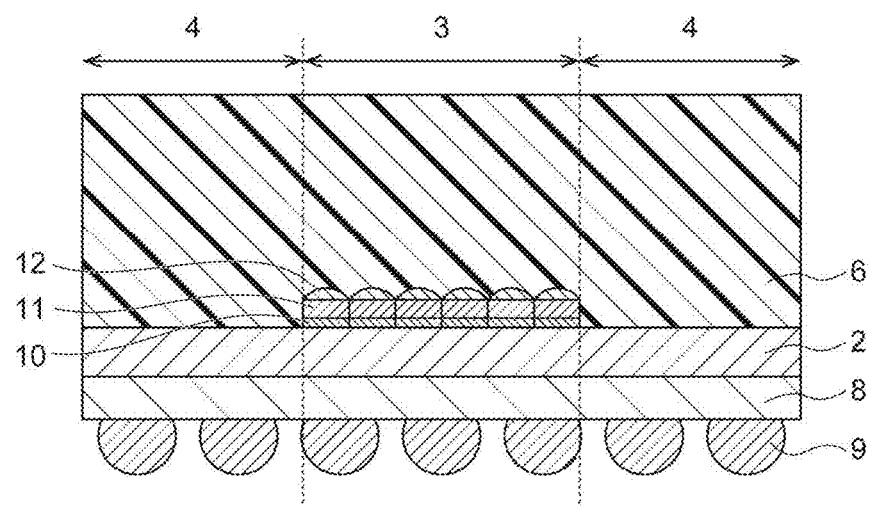
FIG. 16 is a sectional view showing another solid-state imaging element of the embodiment.

As mentioned above, the adhesive composition according to the embodiment provides a cured product having high transparency, airtightness and a high refractive index. Thus, for example, the solid-state imaging element according to the embodiment may not be sealed with a transparent substrate such as a glass substrate, as shown in FIG. 16.

EXAMPLES

Now, present invention will be more specifically described below based on Examples and Comparative Examples; however, the present invention is not limited to the following Examples.

<Synthesis of Acrylic Polymer>

(f-1)

300 g of tricyclo[$5.2.1.0^{2,6}$]deca-8-yl acrylate (FA-513A, trade name, Hitachi Chemical Co., Ltd.), 350 g of butyl acrylate (BA), 300 g of butyl methacrylate (BMA), 50 g of glycidyl methacrylate (GMA) and 50 g of 2-ethylhexyl methacrylate (2EHMA) were mixed. To the monomer mixture, 5 g of lauroyl peroxide and 0.45 g of n-octyl mercaptan serving as chain transfer agent were further dissolved to obtain a mixture solution.

To a 5-L autoclave equipped with a stirrer and a condenser, 0.44 g of polyvinyl alcohol serving as a suspension agent and 2000 g of ion-exchange water were added. Further, the mixture solution prepared above was added thereto while stirring. Polymerization was carried out while stirring at a rotation speed of 250 min$^{-1}$ under a nitrogen atmosphere at 60° C. for 5 hours, and subsequently at 90° C. for two hours to obtain resin particles (polymerization rate was 99% by the weighing method). The resin particles were washed with water, dehydrated and dried to obtain an acrylic polymer (f-1). The weight-average molecular weight Mw of the resultant polymer (f-1) was 480000.

(f-2)

An acrylic polymer (f-2) having a weight-average molecular weight Mw=370000 was obtained in the same manner as in (f-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(f-3)

An acrylic polymer (f-3) was obtained in the same manner as in (f-1) except that 1 mass % of acrylonitrile (AN) was further added to the monomer mixture. The weight-average molecular weight Mw of the obtained (f-3) was 420000.

s(f-4)

An acrylic polymer (f-4) was obtained in the same manner as in (f-1) except that 2 mass % of acrylonitrile (AN) was further added to the monomer mixture. The weight-average molecular weight Mw of the obtained (f-4) was 390000.

(f-5)

An acrylic polymer (f-5) was obtained in the same manner as in (f-1) except that 3 mass % of acrylonitrile (AN) was further added to the monomer mixture. The weight-average molecular weight Mw of the obtained (f-5) was 380000.

(f'-6)

An acrylic polymer (f'-6) having a weight-average molecular weight Mw=50000 was obtained in the same manner as in (f-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(f'-7)

To a 500 mL flask equipped with a stirrer, a reflux condenser, an inert gas inlet and a thermometer, 207 g of ethyl acetate, 33.5 g of methyl methacrylate, 1.5 g of methacrylic acid (MA), 24.5 g of butyl methacrylate (BMA), 3 g of butyl acrylate (BA), 7.5 g of 2-ethylhexyl methacrylate (2EHMA) and 30 g of benzyl acrylate (BzMA) were supplied. The temperature of the mixture was raised to 75° C. under a nitrogen gas atmosphere. While temperature of the flask was kept at 75° C., 0.7 g of 2,2'-azobis(2,4-dimethylvaleronitrile) (ADVN) was added dropwise. The mixture was stirred while heating for 6 hours and then cooled to room temperature to obtain an acrylic polymer (f'-7). The weight-average molecular weight Mw of the obtained (f'-7) was 62000.

Note that, the weight-average molecular weight of the component (f) obtained was measured by gel permeation chromatography (GPC) and converted based on a calibration curve using standard polystyrene. The calibration curve was approximated based on a tertiary expression by use of a standard polystyrene kit, PStQuick series C (trade name, TOSOH CORPORATION). The conditions of GPC are shown below.

Pump: L6000 Pump (Hitachi, Ltd.)
Detector: L3300 RI Monitor (Hitachi, Ltd.)
Column: Gelpack GL-S300MDT-5 (two columns in total) (trade name, Hitachi High-Technologies Corporation)
Column size: 8 mm in diameter×300 mm
Eluent: DMF/THF (mass ratio: 1/1)+LiBr.$H_2O$ 0.03 mol/l+$H_3PO_4$ 0.06 mol/l
Sample concentration: 0.1 mass %
Flow rate: 1 ml/min
Measurement temperature: 40° C.

The resultant acrylic polymers (f-1) to (f-7) were subjected to the following evaluations. The evaluation results are shown in Table 1.

(Initial Transmittance)

The resultant acrylic polymers were each uniformly applied onto a glass substrate (MATSUNAMI MICRO COVER GLASS 40 mm×50 mm THICKNESS No. 1 (trade name), Matsunami Glass Ind., Ltd.), having a size of 4.0 cm×5.0 cm×120 to 170 μm (actually 140 to 160 μm) by use of a spin coater, and dried by a hot plate of 100° C. for 5 minutes to form an adhesive layer having a dry film thickness of 20 In this manner, test substrates were manufactured. The test substrates having such an adhesive layer formed thereon were subjected to measurement of transmittance by use of a spectrophotometer U-3310 (trade name, Hitachi, Ltd.; start: 800 nm, end: 200 nm, scan speed: 600 nm/min, sampling interval: 1.0 nm) within the wavelength range of 300 to 800 nm. Initial transmittance values were evaluated based on the following criteria:

A: Transmittance at wavelength 400 nm is 97% or more.
B: Transmittance at wavelength 400 nm is less than 97%.

(Visual Observation of Appearance and Transmittance of Test Substrate Allowed to Stand Still at 245° C. for 5 Minutes)

The test substrates used in evaluation of the initial transmittance mentioned above were allowed to stand still on a hot plate of 245° C. for 5 minutes. Rolling, crack, white turbidity, outgassing, surface roughness, color change, etc., of the resin during the still standing were visually observed. In addition, transmittance of the substrates was measured.

(Adhesiveness During Heating)

To the adhesive layer of each of the test substrates formed in the same manner as those used in the above initial transmittance test, a glass substrate (MATSUNAMI MICRO COVER GLASS 40 mm×50 mm THICKNESS No. 1 (trade name), Matsunami Glass Ind., Ltd.) each having a size of 4.0 cm×5.0 cm×120 to 170 μm (actually 140 to 160 μm) was bonded at 90° C. by use of a reel laminator to obtain a test substrate of a three-layer structure: glass substrate/adhesive layer/glass substrate. The test substrates thus obtained were allowed to stand still on a hot plate of 245° C. for 5 minutes. During the still standing, whether the glass substrate and the resin are separated from each other was observed. Adhesiveness during heating was evaluated based on the following criteria:

A: Separation (peel-off) was not observed.
B: Separation (peel-off) was observed.

(Tg of the Component (f))

Tg of the component (f) was measured by a method in accordance with JIS K 6240 (Rubber, raw-Determination of the glass transition temperature by differential scanning calorimetry (DSC)).

TABLE 1

| | | Mw | AN | GMA | FA-513A | Tg | Initial transmittance Unit | After 5 min at 245° C. | Adhesiveness during heating |
|---|---|---|---|---|---|---|---|---|---|
| | | | Mass % *1 | Mass % *1 | Mass % *1 | ° C. | Transmittance % A/B | Transmittance % Visual observation | A/B |
| Synthetic compound | (f-1) | 480000 | 0 | 4.7 | 28.5 | 10 | 99% A | 99% No change | B |
| | (f-2) | 370000 | 0 | 2.4 | 0 | 10 | 99% A | 98% No change | B |
| | (f-3) | 420000 | 1 | 4.7 | 28.5 | 10 | 99% A | 99% No change | B |
| | (f-4) | 390000 | 2 | 4.7 | 28.5 | 10 | 99% A | 99% No change | B |
| | (f-5) | 380000 | 3 | 4.6 | 28.4 | 12 | 99% A | 98% No change | B |
| | (f-6) | 50000 | 0 | 2.4 | 0 | 0 | 99% A | 98% No change | B |
| | (f-7) | 62000 | 0 | 0 | 0 | −5 | 99% A | 99% Surface roughness | B |

*1: Content to whole monomer mixture

From the above results, it was found that acrylic polymers have high initial transparency regardless of molecular weight, etc., and that acrylic polymers having a low ratio of a nitrogen atom-containing group, have coloring resistance even after it was allowed to standstill at 245° C. for 5 minutes. In contrast, it was found that the adhesiveness during heating is not ensured by a component only containing a resin.

Adhesive compositions were obtained by blending a component (a), a component (b), a component (c), a component (d), a component (e), a component (f) and other components, in accordance with the following Tables 2 to 9. The resultant adhesive compositions were each subjected to evaluation for the transmittance after curing, transmittance and peel resistance during a reflow process after still standing for 15 minutes after curing at 260° C. Note that, the notation in each Table is as follows. The numeric values of components excluding an organic solvent in each Table are solid contents represented in terms of parts by mass. Note that the solid content used in the specification refers to a nonvolatile content of an adhesive composition excluding volatile substances such as water and a solvent, more specifically, refers to components except a solvent, remaining without volatile in a drying step and including components present in a liquid, syrupy and waxy state at room temperature near 25° C.

(Component (a))
UN-952 (trade name of urethane acrylate oligomer, Negami Chemical Industrial Co., Ltd., the number of functional groups: 10, Mw=6500 to 11000)
BPE-100 (trade name of ethylene oxide-modified bisphenol A dimethacrylate, SHIN-NAKAMURA CHEMICAL CO., LTD.)

BPE-500 (trade name of ethylene oxide-modified bisphenol A dimethacrylate, SHIN-NAKAMURA CHEMICAL CO., LTD.)

PE-3A (trade name of pentaerythritol triacrylate, KYOEISHA CHEMICAL Co., Ltd.)

A-DCP (trade name of tricyclodecanedimethanol diacrylate, SHIN-NAKAMURA CHEMICAL CO., LTD.)

FA-P240A (trade name of a polypropylene glycol diacrylate, Hitachi Chemical Co., Ltd.)

FA-270A (trade name of polyethylene glycol diacrylate, Hitachi Chemical Co., Ltd.)

A-DOG (trade name of dioxane glycol diacrylate, SHIN-NAKAMURA CHEMICAL CO., LID.)

A-9300 (trade name of ethylene oxide-modified isocyanuric acid triacrylate, SHIN-NAKAMURA CHEMICAL CO., LTD.)

(Comparative Component to (a))

BAH-100Y (trade name of epoxy acrylate (monofunctional acrylate), SHIN-NAKAMURA CHEMICAL CO., LTD.)

LA (trade name of lacryl acrylate (monofunctional acrylate), KYOEISHA CHEMICAL Co., Ltd.)

A-LEN-10 (trade name of ethylene oxide-modified o-phenylphenol acrylate (monofunctional acrylate), SHIN-NAKAMURA CHEMICAL CO., LTD.)

EHPE3150 (trade name of alicyclic epoxy resin, Daicel Corporation)

(Component (b))

PERCUMYL D (trade name of dicumyl peroxide, NOF CORPORATION, one hour half-life temperature: 135.7° C., 10 hours half-life temperature: 116.4° C.)

(Component (c))

AO-80 (trade name of a hindered phenolic antioxidant: bis[3-(3-tert-butyl-4-hydroxy-5-methylphenyl)propi ovate] (2,4,8,10-tetra oxaspiro[5.5]undecane-3,9-diyl) bis(2,2-dimethyl-2,1-ethanediyl), ADEKA CORPORATION.)

AO-60 (trade name of a hindered phenolic antioxidant, tetrakis[3-(3',5'-di-t-butyl-4'-hydroxyphenyl)propionic acid]pentaerythritol, ADEKA CORPORATION)

(Component (d))

AO-503 (trade name of a thioether antioxidant, ditridecyl 3,3-thiobispropionate, ADEKA CORPORATION)

AO-412S (trade name of a thioether antioxidant, 2,2-bis[[3-(dodecylthio)-1-oxopropyloxy]methyl]-1,3-propanediyl bis[3-(dodecylthio)propionate], ADEKA CORPORATION)

(Component (e))

Karenz MT NR1 (trade name of 1,3,5-tris(3-mercaptobutyryloxyethyl)-1,3,5-triazine-2,4,6(1H,3H,5H)-trione, SHOWA DENKO K.K.)

(Component (f))

As a comparative component (f), (f-1) to (f-7) synthesized by the aforementioned methods and polymethylmethacrylate (PMMA) were used.

(Adhesion Aid)

KBM-503 (trade name of a silane coupling agent, 3-(trimethoxysilyl)propyl methacrylate, Shin-Etsu Chemical Co., Ltd.)

AY43-001 (trade name of a silane coupling agent, Dow Corning CORPORATION)

(Epoxy Curing Accelerator)

1B2PZ (trade name of 1-benzyl-2-phenyl imidazole, SHIKOKU CHEMICALS CORPORATION.)

(Photopolymerization Initiator)

I-819 (trade name of bis(2,4,6-trimethylbenzoyl)-phenylphosphineoxide, BASF)

I-184 (trade name of 1-hydroxy-cyclohexylphenyl ketone, BASF)

(Organic Solvent)

DMAc (chemical substance name of dimethylacetamide, KANTO KAGAKU.)

Cyclohexanone (chemical substance name, KANTO KAGAKU.)

MEK (chemical substance name of methyl ethyl ketone, KANTO KAGAKU.)

<Transmittance after Curing>

Solutions of the adhesive compositions obtained in Examples and Comparative Examples were each uniformly applied onto a glass substrate (MATSUNAMI MICRO COVER GLASS 40 mm×50 mm THICKNESS No. 1 (trade name), Matsunami Glass Ind., Ltd.), having a size of 4.0 cm×5.0 cm×120 to 170 µm (actually 140 to 160 µm) by use of a spin coater, and dried by a hot plate of 100° C. for 5 minutes to form an adhesive layer having a dry film thickness of 20 µm. The glass substrates having the adhesive layer formed thereon except those of Comparative Examples 2, 3, 4 and 10 were further cured in an oven of 150° C. for 2 hours to prepare test substrates. Note that, in Comparative Examples 2, 3, 4 and 10, in which a photopolymerization initiator was used in place of the component (b), photo-curing was performed by applying light at 5000 mJ/cm$^2$ to prepare test substrates. The test substrates were subjected to measurement of transmittance by use of a spectrophotometer U-3310 (trade name, Hitachi, Ltd.; start: 800 nm, end: 200 nm, scan speed: 600 nm/min, sampling interval: 1.0 nm) within the wavelength range of 800 to 300 nm.

<Transmittance of Test Substrate Allowed to Stand Still at 265° C. for 15 Minutes>

The test substrates used in the aforementioned measurement of transmittance after curing were allowed to stand still on a hot plate of 265° C. for 15 minutes and thereafter subjected to measurement of transmittance by use of a spectrophotometer U-3310 (trade name, Hitachi, Ltd.; start: 800 nm, end: 200 nm, scan speed: 600 nm/min, sampling interval: 1.0 nm) within the wavelength range of 800 to 300 nm.

<Peel Resistance During a Reflow Process>

Glass substrates having the adhesive resin layer formed thereon were obtained in the same manner as described in the section of transmittance after curing. To the adhesive resin layer of each of the glass substrates, a glass substrate (MATSUNAMI MICRO COVER GLASS 40 mm×50 mm THICKNESS No. 1 (trade name), Matsunami Glass Ind., Ltd.) each having a size of 4.0 cm×5.0 cm×120 to 170 µm (actually 140 to 160 µm) was bonded to obtain a test substrate having a three-layer structure consisting of glass substrate/adhesive layer/glass substrate. The test substrates except those of Comparative Examples 2, 3, 4 and 10 were further cured by heating in an oven of 150° C. for 2 hours. The test substrates of Comparative Examples 2, 3, 4 and 10 were subjected to photo-curing by applying light at 5000 mJ/cm$^2$. These test substrates were allowed to stand still on a hot plate of 260° C. for 15 minutes, then returned to the environment of room temperature (25° C.) and kept there for 5 minutes. The appearance of the test substrates was visually observed and peel resistance during a reflow process was evaluated based on the following criteria.

A: No abnormal appearance was observed.
B: A peel-off was observed in part of a substrate.
C: A peel-off was observed in a whole substrate.

<Tg of a Cured Product, Elastic Modulus of Cured Product at 25° C.>

Solutions of the adhesive compositions of Examples and Comparative Examples were each uniformly applied onto a release PET FILM by a knife coater and dried in the oven at 115° C. for 15 minutes to form an adhesive layer having a dry film thickness of 25 μm. Four adhesive layers thus prepared were bonded to obtain a thickness of 100 μm. The laminate was cured at 180° C. for 2 hours in the oven. The Tg of a cured product and elastic modulus thereof at 25° C. were measured by a viscoelasticity tester (RSA-III: trade name, TA Instruments. Japan). Note that measurement was performed in the conditions: test mode: tension test; test temperature: −50° C. to 300° C.; temperature raising rate: 5° C./minute; frequency: 1 Hz; distance between chucks: 20 mm.

The Tg of a cured product was evaluated based on the following criteria:
A: 0° C. or more.
B: less than 0° C.

The elastic modulus of a cured product at 25° C. was evaluated based on the following criteria:
A: 10 GPa or less and 0.01 GPa or more.
B: less than 0.01 GPa.

TABLE 2

| | | Example 1 | Example 2 | Example 3 | Example 4 | Comparative Example 1 |
|---|---|---|---|---|---|---|
| Component (a) | UN-952 | 80 | 80 | 80 | 80 | 80 |
| | BPE-100 | 15 | 15 | 15 | 15 | 15 |
| Component (b) | PERCUMYL D | 1 | 1 | 1 | 1 | 1 |
| Component (c) | AO-80 | 0.1 | 0.3 | 0.1 | 0.1 | — |
| Component (d) | AO-412S | 0.1 | 0.1 | 0.3 | 0.1 | — |
| Component (e) | Karenz MT NR1 | 0.1 | 0.1 | 0.1 | 0.3 | — |
| Adhesive aid | KBM-503 | 1 | 1 | 1 | 1 | 1 |
| Organic solvent | DMAc | 25 | 25 | 25 | 25 | 25 |
| Transmittance after curing | 400 nm | 98.6 | 99.1 | 98.6 | 99 | 96.9 |
| Transmittance after still standing at 265° C. for 15 minutes | 400 nm | 85.4 | 97 | 91.5 | 89.5 | 61 |
| Difference in transmittance | | 13.2 | 2.1 | 7.1 | 9.5 | 35.9 |
| Peel resistance during a reflow process | | A | A | A | A | A |
| Tg of cured product | | A | A | A | A | A |
| Elastic modulus of cured product at 25° C. | | A | A | A | A | A |

TABLE 3

| | | Example 5 | Example 6 | Example 7 | Example 8 | Example 9 | Example 10 |
|---|---|---|---|---|---|---|---|
| Component (a) | UN-952 | 80 | 80 | 80 | 80 | 80 | 80 |
| | BPE-500 | 15 | — | — | — | — | — |
| | PE-3A | — | 15 | — | — | — | — |
| | A-DCP | — | — | 15 | — | — | — |
| | BPE-100 | — | — | — | 15 | 15 | 15 |
| Component (b) | PERCUMYL D | 1 | 1 | 1 | 1 | 1 | 1 |
| Component (c) | AO-80 | 0.1 | 0.3 | 0.3 | — | — | — |
| | AO-60 | — | — | — | 0.1 | 0.3 | 1 |
| Component (d) | AO-412S | 0.1 | 0.1 | 0.1 | 0.1 | 0.1 | 0.1 |
| Component (e) | Karenz MT NR1 | 0.1 | 0.1 | 0.1 | 0.3 | 0.3 | 0.3 |
| Adhesive aid | AY43-001 | 1 | — | — | — | — | — |
| | KBM-503 | — | 1 | 1 | 1 | 1 | 1 |
| Organic solvent | DMAc | 25 | 25 | 25 | 25 | 25 | 25 |
| Transmittance after curing | 400 nm | 99.0 | 98.9 | 99.8 | 98.9 | 99.5 | 99.3 |
| Transmittance after still standing at 265° C. for 15 minutes | 400 nm | 90.7 | 91.2 | 93.5 | 82.9 | 98.7 | 94.7 |
| Difference in transmittance | | 8.3 | 7.7 | 6.3 | 16.0 | 0.8 | 4.6 |
| Peel resistance during a reflow process | | A | A | A | A | A | B |
| Tg of cured product | | A | A | A | A | A | A |
| Elastic modulus of cured product at 25° C. | | A | A | A | A | A | A |

TABLE 4

|  |  | Example 11 | Example 12 | Example 13 | Example 14 | Example 15 |
|---|---|---|---|---|---|---|
| Component (a) | A-DOG | 50 | 50 | 50 | 50 | 50 |
| Component (b) | PERCUMYL D | 1 | 1 | 1 | 1 | 1 |
| Component (c) | AO-80 | 2.5 | 2.5 | 2.5 | 2.5 | 2.5 |
| Component (d) | AO-503 | 0.5 | 0.5 | 0.5 | 0.5 | 0.5 |
| Component (e) | Karenz MT NR1 | 0.5 | 0.5 | 0.5 | 0.5 | 0.5 |
| Component (f) | (f-1) | 50 | — | — | — | — |
|  | (f-2) | — | 50 | — | — | — |
|  | (f-3) | — | — | 50 | — | — |
|  | (f-4) | — | — | — | 50 | — |
|  | (f-5) | — | — | — | — | 50 |
| Organic solvent | Cyclohexanone | 250 | 250 | 250 | 250 | 250 |
| Transmittance after curing | 400 nm | 99.9 | 99.2 | 99.9 | 99.5 | 99.8 |
| Transmittance after still standing at 265° C. for 15 minutes | 400 nm | 98.6 | 98.2 | 98.5 | 97.3 | 97.7 |
| Difference in transmittance |  | 1.3 | 1.0 | 1.4 | 2.2 | 2.1 |
| Peel resistance during a reflow process |  | A | A | A | A | A |
| Tg of cured product |  | A | A | A | A | A |
| Elastic modulus of cured product at 25° C. |  | A | A | A | A | A |

TABLE 5

|  |  | Example 16 | Example 17 | Example 18 |
|---|---|---|---|---|
| Component (a) | BPE-100 | 15 | — | — |
|  | PE-3A | — | 15 | — |
|  | A-9300 | — | — | 15 |
| Component (b) | PERCUMYL D | 1 | 1 | 1 |
| Component (c) | AO-80 | 0.1 | 0.1 | 0.1 |
| Component (d) | AO-503 | 0.1 | 0.1 | 0.1 |
| Component (e) | Karenz MT NR1 | 0.1 | 0.1 | 0.1 |
| Component (f) | (f-2) | 80 | 80 | 80 |
| Organic solvent | Cyclohexanone | 240 | 240 | 240 |
| Transmittance after curing | 400 nm | 99.5 | 99.9 | 99.7 |
| Transmittance after still standing at 265° C. for 15 minutes | 400 nm | 95.6 | 97.4 | 96.5 |
| Difference in transmittance |  | 3.9 | 2.5 | 3.2 |
| Peel resistance during a reflow process |  | A | A | A |
| Tg of cured product |  | A | A | A |
| Elastic modulus of cured product at 25° C. |  | A | A | A |

TABLE 6

|  |  | Example 19 | Example 20 | Example 21 | Example 22 |
|---|---|---|---|---|---|
| Component (a) | UN-952 | 80 | 80 | 80 | 45 |
|  | BPE-100 | 15 | — | — | 50 |
|  | BPE-500 | — | 15 | 15 | — |
| Component (b) | PERCUMYL D | 1 | 1 | 1 | 1 |
| Component (c) | AO-80 | 0.3 | 0.3 | 0.3 | 2.5 |
| Component (d) | AO-503 | 0.1 | — | — | 0.5 |
|  | AO-412S | — | 0.1 | 0.1 | — |
| Component (e) | Karenz MT NR1 | 0.1 | 0.1 | 0.1 | 0.1 |
| Adhesive aid | KBM-503 | 1 | 1 | — | — |
| Organic solvent | DMAc | 25 | 25 | 25 | 25 |
| Transmittance after curing | 400 nm | 99.0 | 98.9 | 99.1 | 99.2 |

TABLE 6-continued

|  | Example 19 | Example 20 | Example 21 | Example 22 |
|---|---|---|---|---|
| Transmittance 400 nm after still standing at 265° C. for 15 minutes | 96.7 | 90.7 | 90.9 | 95.4 |
| Difference in transmittance | 2.3 | 8.2 | 8.2 | 3.8 |
| Peel resistance during a reflow process | A | A | A | A |
| Tg of cured product | A | A | A | A |
| Elastic modulus of cured product at 25° C. | A | A | A | A |

TABLE 7

|  |  | Comparative Example 2 | Comparative Example 3 | Comparative Example 4 | Comparative Example 5 | Comparative Example 6 |
|---|---|---|---|---|---|---|
| Component (a) | PE-3A | 15 | — | — | — | — |
|  | FA-P240A | 25 | — | — | — | — |
|  | FA-270A | — | 5 | — | — | — |
|  | UN-952 | — | — | 80 | 80 | — |
|  | BPE-100 | — | — | 15 | 15 | — |
| Comparative component to (a) | EHPE3150 | — | — | — | — | 15 |
| Component (b) | PERCUMYL D | — | — | — | — | 1 |
| Component (c) | AO-80 | 0.1 | 0.01 | 0.1 | 0.1 | 0.1 |
| Component (d) | AO-503 | 0.1 | 0.01 | 0.1 | 0.1 | 0.1 |
| Component (e) | Karenz MT NR1 | 0.1 | 0.01 | 0.1 | 0.1 | 0.1 |
| Comparison of component (f) | (f-7) | 60 | — | — | — | — |
|  | PMMA | — | 5 | — | — | — |
|  | (f-2) | — | — | — | — | 80 |
| Photopolymerization initiator | I-819 | 0.1 | — | — | — | — |
|  | I-184 | — | 0.1 | 1 | — | — |
| Adhesive aid | KBM-503 | — | — | 1 | 1 | — |
| Organic solvent | Cyclohexanone | — | — | — | — | 240 |
|  | DMAc | 25 | — | 25 | 25 | — |
|  | MEK | — | 15 | — | — | — |
| Transmittance after curing | 400 nm | 99.9 | 98.4 | 98.7 | 98.8 | 98.2 |
| Transmittance after still standing at 265° C. for 15 minutes | 400 nm | 95.0 | 97.6 | 86.0 | *2 | 95.6 |
| Difference in transmittance |  | 4.9 | 0.8 | 12.7 | — | 2.6 |
| Peel resistance during a reflow process |  | C | C | C | *3 | C |

*2: Condensed into liquid and immeasurable. Transparency was maintained.
*3: Not peeled but liquefied and leaked from sides.

TABLE 8

|  |  | Comparative Example 7 | Comparative Example 8 | Comparative Example 9 | Comparative Example 10 |
|---|---|---|---|---|---|
| Comparative component to (a) | BAH-100Y | 15 | — | — | — |
|  | LA | — | 15 | 50 | — |
| Component (a) | BPE-100 | — | — | — | 15 |
| Component (b) | PERCUMYL D | 1 | 1 | 1 | — |
| Component (c) | AO-80 | 0.1 | 0.1 | 2.5 | 0.1 |
| Component (d) | AO-503 | 0.1 | 0.1 | 0.5 | 0.1 |
| Component (e) | Karenz MT NR1 | 0.1 | 0.1 | 0.5 | 0.1 |
| Component (f) | (f-2) | 80 | 80 | 50 | 80 |
| Adhesive aid | KBM-503 | — | — | — | — |
| Photopolymerization initiator | I-184 | — | — | — | 1 |
| Organic solvent | Cyclohexanone | 240 | 240 | 250 | 240 |

TABLE 8-continued

|  |  | Comparative Example 7 | Comparative Example 8 | Comparative Example 9 | Comparative Example 10 |
|---|---|---|---|---|---|
| Transmittance after curing | 400 nm | 96.5 | 99.7 | 99.6 | 99.8 |
| Transmittance after still standing at 265° C. for 15 minutes | 400 nm | 88.5 | 97.7 | 96.7 | 95.7 |
| Difference in transmittance |  | 8.0 | 2.0 | 2.9 | 4.1 |
| Peel resistance during a reflow process |  | C | C*4 | C*4 | C |

*4Peel-off was observed at the time of curing by heating at 150° C. for 2 hours.

TABLE 9

|  |  | Comparative Example 11 | Comparative Example 12 | Comparative Example 13 | Comparative Example 14 | Comparative Example 15 | Comparative Example 16 |
|---|---|---|---|---|---|---|---|
| Component (a) | UN-952 | 80 | 80 | 80 | 80 | 80 | 80 |
|  | BPE-100 | 15 | 15 | 15 | 15 | — | 15 |
|  | BPE-500 | — | — | — | — | 15 | — |
| Component (b) | PERCUMYL D | 1 | 1 | 1 | 1 | 1 | 1 |
| Component (c) | AO-80 | 0.3 | — | — | — | 0.3 | — |
|  | AO-60 | — | — | — | 0.3 | — | — |
| Component (d) | AO-503 | — | 0.1 | — | — | — | 0.1 |
|  | AO-412S | — | — | — | 0.1 | — | — |
| Component (e) | Karenz MT NR1 | — | — | 0.1 | — | 0.1 | 0.1 |
| Adhesive aid | KBM-503 | 1 | 1 | 1 | 1 | 1 | 1 |
| Organic solvent | DMAc | 25 | 25 | 25 | 25 | 25 | 25 |
| Transmittance after curing | 400 nm | 98.4 | 96.8 | 96.7 | 98.6 | 99.0 | 97.0 |
| Transmittance after still standing at 265° C. for 15 minutes | 400 nm | 74.5 | 62.3 | 61.1 | 79.7 | 74.8 | 61.2 |
| Difference in transmittance |  | 23.9 | 34.5 | 35.6 | 18.9 | 24.2 | 35.8 |
| Peel resistance during a reflow process |  | A | A | A | A | A | A |

According to the evaluation results of individual Examples shown in Tables 2 to 6, it was found that the adhesive composition of the present invention, which comprises a component (a), a component (b), a component (c), a component (d) and a component (e), exhibits an excellent effect: evaluation of peel resistance during a reflow process: A or B or more (Examples 1 to 22). Note that, in the present invention, if the peel resistance during a reflow process is evaluated as B or more, it is determined that the adhesive composition can provide a cured product which does not peel after the reflow process to be performed at 260° C.

In individual Examples, transmittance after curing and transmittance after still standing at 265° C. for 15 minutes are both 80% or more. From this, it was found that transparency was high even after curing, and that coloration by heating at 260° C. could be suppressed (Examples 1 to 22). Note that, in the present invention, if each of the above transmittance values is 80% or more, it is determined that the adhesive composition has high transparency.

In contrast, as shown in the evaluation results of individual Comparative Examples shown in Tables 2 and 7 to 9, since Comparative Example 1 did not comprise a component (c), a component (d) or a component (e), evaluation results on transmittance after curing and peel resistance during a reflow process were good; however, transmittance after still standing at 265° C. for 15 minutes was as low as about 60%. This is considered because a component (c), a component (d) and a component (e) suppress generation of a substance causing coloration during heating. In particular, when Examples 1 to 4 and 8 to 10 are compared with each other, it was found that a component (c) among these components has a significant effect on suppressing coloration after still standing at 265° C. for 15 minutes and a component (e) has a secondary significant effect. This suggests that deterioration of resins of a component (a), a component (b) and possibly a component (f) in the resin at 265° C. is caused by ROO radicals generated by oxidation, and that a component (c) is first involved in trapping the radicals, and then, the component (e) contributes to decomposition of quinones generated after the component (c) is consumed.

Comparative Examples 2 to 4 and 10 are compositions to be cured by a photopolymerization initiator. The cured products thereof were excellent in transmittance but the peel resistance during a reflow process was evaluated as C. This is considered because a curing reaction did not sufficiently proceed in photo-curing or peel-off occurred due to the remaining unreacted acrylate.

In Comparative Example 5, since a polymerization initiator is not comprised, the sample was aggregated during curing at 150° C. for 2 hours and the thickness of a film failed to be uniform. Thus, it was difficult to measure transmittance. Thereafter, when the film was allowed to stand still at 265° C. for 15 minutes on a hot plate, the film changed into liquid. When the sample to be subjected to evaluation of peel resistance during a reflow process was allowed to stand still at 265° C. for 15 minutes, the resin portion thereof changed into liquid. No peel-off was observed; however, the liquid leakage from between glass substrates was observed. From this, it was clear that the composition does not serve as an adhesive.

Comparative Examples 6 and 7 employed an epoxy and an epoxy-acrylate as a crosslinking component. However, presumably because phase separation with epoxy occurred or cure shrinkage thereof was not sufficiently reduced by an acrylic polymer, the peel resistance during a reflow process was evaluated as C, with the result that peel-off occurred.

Comparative Examples 8 and 9 are reaction systems using a monofunctional acrylate. The transmittance was satisfactory; however, the peel resistance during a reflow process was evaluated as C. They were unsuitable.

Comparative Examples 11 to 16 are adhesive compositions lacking any one or two components of a component (c), a component (d) and a component (e). Transmittance after curing and peel resistance during a reflow process were evaluated as satisfactory; however, transmittance after still standing at 265° C. for 15 minutes was found to be poor. This is considered because when any one or two components of a component (c), a component (d) and a component (e) are not comprised, generation of a compound causing coloration, more specifically, a compound reducing transmittance, cannot be sufficiently suppressed. In other words, the adhesive composition comprising a component (c), a component (d) and a component (e) according to the embodiment can exert a particularly significant synergetic effect.

In view of Examples and Comparative Examples, the present invention can provide an adhesive composition that can be used in a transparent adhesive for use in sensors such as a light emitter and a light receiving section and that suppress coloration and peel-off during a reflow process at 260° C., and can provide a semiconductor device using the composition.

REFERENCE SIGNS LIST

1 . . . Solid-state imaging element, 2 . . . Silicon substrate, 3 . . . Sensor section, Light receiving section, 4 . . . Peripheral circuit, 5, 26, 32 . . . Glass substrate, 6 . . . Adhesive layer, 7 . . . Frame-like adhesive layer, 8 . . . Wiring layer, 9, 28 . . . Solder ball, 10 . . . Photodiode, 11 . . . Color filter, 12 . . . Microlens, 20 . . . Cavity, 22, 42 . . . Substrate, 24 . . . Resin layer, 34 . . . Adhesive composition, 36 . . . Support film, 38 . . . roller, 40 . . . Support base, 44 . . . Sensor, 46 . . . Weir, 48 . . . Chip.

The invention claimed is:

1. An adhesive composition comprising:
(a) a compound having at least two ethylenically unsaturated groups,
(b) a thermal polymerization initiator,
(c) a hindered phenolic compound,
(d) a thioether compound,
(e) a compound having a thiol group, and
(f) an acrylic polymer having a weight-average molecular weight of 100000 or more,
wherein the acrylic polymer having a weight-average molecular weight of 100000 or more contains a structural unit having an epoxy group.

2. The adhesive composition according to claim 1, for use in optical parts.

3. A cured-resin product obtained from the adhesive composition according to claim 2.

4. A method for manufacturing a semiconductor device comprising:

a step of forming an adhesive layer of the adhesive composition according to claim 2 on a semiconductor substrate,
a step of sandwiching the adhesive layer between the semiconductor substrate and a transparent substrate, and applying pressure onto the semiconductor substrate and the transparent substrate for bonding, and
a step of curing the adhesive layer.

5. The adhesive composition according to claim 2, wherein the compound having at least two ethylenically unsaturated groups includes a urethane-based compound having (meth) acryloyl groups.

6. A cured-resin product obtained from the adhesive composition according to claim 5.

7. A method for manufacturing a semiconductor device comprising:
a step of forming an adhesive layer of the adhesive composition according to claim 5 on a semiconductor substrate,
a step of sandwiching the adhesive layer between the semiconductor substrate and a transparent substrate, and applying pressure onto the semiconductor substrate and the transparent substrate for bonding, and
a step of curing the adhesive layer.

8. The adhesive composition according to claim 1, wherein the compound having at least two ethylenically unsaturated groups includes a urethane-based compound having (meth) acryloyl groups.

9. A cured-resin product obtained from the adhesive composition according to claim 8.

10. A method for manufacturing a semiconductor device comprising:
a step of forming an adhesive layer of the adhesive composition according to claim 8 on a semiconductor substrate,
a step of sandwiching the adhesive layer between the semiconductor substrate and a transparent substrate, and applying pressure onto the semiconductor substrate and the transparent substrate for bonding, and
a step of curing the adhesive layer.

11. A cured-resin product obtained from the adhesive composition according to claim 1.

12. A solid-state imaging element comprising:
a semiconductor substrate having a light receiving section provided on the upper surface,
an adhesive layer provided on the semiconductor substrate so as to cover the light receiving section, and
a transparent substrate bonded to the semiconductor substrate by the adhesive layer, wherein
the adhesive layer is the cured-resin product according to claim 11.

13. A method for manufacturing a semiconductor device comprising:
a step of forming an adhesive layer of the adhesive composition according to claim 1 on a semiconductor substrate,
a step of sandwiching the adhesive layer between the semiconductor substrate and a transparent substrate, and applying pressure onto the semiconductor substrate and the transparent substrate for bonding, and
a step of curing the adhesive layer.

* * * * *